US011805628B2

(12) United States Patent
Takeuchi et al.

(10) Patent No.: US 11,805,628 B2
(45) Date of Patent: Oct. 31, 2023

(54) POWER CONVERSION DEVICE

(71) Applicant: DENSO CORPORATION, Kariya (JP)

(72) Inventors: Kazuya Takeuchi, Kariya (JP); Tomohiro Shimazu, Kariya (JP)

(73) Assignee: DENSO CORPORATION, Kariya (JP)

( * ) Notice: Subject to any disclaimer, the term of this patent is extended or adjusted under 35 U.S.C. 154(b) by 184 days.

(21) Appl. No.: 17/510,938

(22) Filed: Oct. 26, 2021

(65) Prior Publication Data
US 2022/0046832 A1     Feb. 10, 2022

Related U.S. Application Data

(63) Continuation of application No. PCT/JP2020/015763, filed on Apr. 8, 2020.

(30) Foreign Application Priority Data

Apr. 26, 2019   (JP) ................. 2019-086338

(51) Int. Cl.
*H05K 7/20*     (2006.01)
*H01L 23/40*     (2006.01)
(Continued)

(52) U.S. Cl.
CPC ......... *H05K 7/20927* (2013.01); *H01L 23/40* (2013.01); *H01L 23/473* (2013.01); *H02M 7/537* (2013.01)

(58) Field of Classification Search
CPC ............ H05K 7/20927; H05K 7/20145; H01L 23/473; H01L 23/40; H01L 23/4012;
(Continued)

(56) References Cited

U.S. PATENT DOCUMENTS 6,550,781 B1 *   4/2003   Robotham ............ B21B 31/078
                                             277/565
2004/0124289 A1 *   7/2004   Yamamoto ............ F16K 15/205
                                             239/DIG. 19
(Continued)

FOREIGN PATENT DOCUMENTS

JP     2015-15815 A     1/2015
JP     2015-53763 A     3/2015
(Continued)

OTHER PUBLICATIONS

Jun. 2, 2020 International Search Report issued in International Application No. PCT/JP2020/015763.

*Primary Examiner* — Adam B Dravininkas
(74) *Attorney, Agent, or Firm* — Oliff PLC

(57) ABSTRACT

A power conversion device includes a connector and a sealing member. The connector is connected to a lead-in pipe of a cooling device on the outside of a case. The sealing member makes a watertight seal between a refrigerant flow pipe, which is the lead-in pipe, and the connector. The sealing member includes a connector-side tubular portion, a first watertight seal projection, and a second watertight seal projection. The connector-side tubular portion is located between an inner peripheral surface of the connector and an outer peripheral surface of the lead-in pipe. The first watertight seal projection projects radially outward in an annular shape from the connector-side tubular portion toward the inner peripheral surface of the connector. The second watertight seal projection projects radially inward in an annular shape from the connector-side tubular portion toward the outer peripheral surface of the lead-in pipe.

15 Claims, 15 Drawing Sheets

(51) Int. Cl.
*H01L 23/473* (2006.01)
*H02M 7/537* (2006.01)

(58) Field of Classification Search
CPC ...... H02M 7/537; H02M 1/007; H02M 1/008; H02M 1/088; H02M 3/158; H02M 7/003
See application file for complete search history.

(56) References Cited

U.S. PATENT DOCUMENTS

| | | | |
|---|---|---|---|
| 2013/0335918 A1* | 12/2013 | Tachibana | H05K 7/20927 361/689 |
| 2016/0374235 A1* | 12/2016 | Sakamoto | H05K 7/20927 |
| 2017/0335705 A1* | 11/2017 | Tyler, Jr. | F01D 11/005 |
| 2020/0284362 A1* | 9/2020 | Hashimoto | F16K 11/0876 |
| 2020/0308972 A1* | 10/2020 | Tyler | F01D 11/005 |

FOREIGN PATENT DOCUMENTS

| | | |
|---|---|---|
| JP | 2016-52204 A | 4/2016 |
| JP | 2017-51062 A | 3/2017 |

\* cited by examiner

POWER CONVERSION DEVICE

CROSS-REFERENCE TO RELATED APPLICATION

This application is the U.S. bypass application of International Application No. PCT/JP2020/015763 filed on Apr. 8, 2020 which designated the U.S. and claims priority to Japanese Patent Application No. 2019-086338 filed on Apr. 26, 2019, the contents of both of which are incorporated herein by reference.

TECHNICAL FIELD

The present disclosure relates to a power conversion device.

BACKGROUND

Conventionally, a power conversion device that converts DC power from a battery to AC power is mounted on, for example, electric cars and hybrid cars to drive a motor for moving a vehicle. JP 2017-51062 A discloses a power conversion device that includes semiconductor modules each of which including a switching element, a cooling device for cooling the semiconductor modules, a case that accommodates the semiconductor modules and the cooling device, and a connecting pipe located between the case and a refrigerant outflow pipe through which a refrigerant flows out from the cooling device.

SUMMARY

One aspect of the present disclosure provides a power conversion device that includes a semiconductor module, a cooling device, a case, a connector, and a sealing member.

The semiconductor module includes a switching element. The cooling device includes a heat exchanger capable of exchanging heat with the semiconductor module, a lead-in pipe that introduces a refrigerant to the heat exchanger, and a discharge pipe that discharges the refrigerant from the heat exchanger. The case accommodates the semiconductor module and the cooling device. The connector is connected to a refrigerant flow pipe, which is at least one of the lead-in pipe and the discharge pipe of the cooling device on an outside of the case. The sealing member makes a watertight seal between the refrigerant flow pipe and the connector.

The sealing member includes a connector-side tubular portion, a first watertight seal projection, and a second watertight seal projection. The connector-side tubular portion is located between an inner peripheral surface of the connector and an outer peripheral surface of the refrigerant flow pipe. The first watertight seal projection projects radially outward in an annular shape from the connector-side tubular portion toward the inner peripheral surface of the connector. The second watertight seal projection projects radially inward in an annular shape from the connector-side tubular portion toward the outer peripheral surface of the refrigerant flow pipe.

The refrigerant flow pipe is located in a through-hole formed through the case. When the sealing member is referred to as a first sealing member, a second sealing member is provided to make an airtight seal between the through-hole of the case and the refrigerant flow pipe at a position closer to the heat exchanger of the cooling device than the first sealing member.

The second sealing member includes a case-side tubular portion, a first airtight seal projection, and a second airtight seal projection. The case-side tubular portion is located between an inner peripheral surface of the through-hole and the outer peripheral surface of the refrigerant flow pipe. The first airtight seal projection projects radially outward in an annular shape from the case-side tubular portion toward the inner peripheral surface of the through-hole. The second airtight seal projection projects radially inward in an annular shape from the case-side tubular portion toward the outer peripheral surface of the refrigerant flow pipe.

The first sealing member and the second sealing member define a gap therebetween, and the gap serves as a refrigerant discharging passage that connects a space between the first sealing member and the outer peripheral surface of the refrigerant flow pipe to the outside of the case.

Another aspect of the present disclosure provides a power conversion device that includes a semiconductor module, a cooling device, a case, a connector, and a sealing member.

The semiconductor module includes a switching element. The cooling device includes a heat exchanger capable of exchanging heat with the semiconductor module, a lead-in pipe that introduces a refrigerant to the heat exchanger, and a discharge pipe that discharges the refrigerant from the heat exchanger. The case accommodates the semiconductor module and the cooling device. The connector is connected to a refrigerant flow pipe, which is at least one of the lead-in pipe and the discharge pipe of the cooling device on an outside of the case. The sealing member makes a watertight seal between the refrigerant flow pipe and the connector.

The sealing member includes a connector-side tubular portion, a first watertight seal projection, and a second watertight seal projection. The connector-side tubular portion is located between an inner peripheral surface of the connector and an outer peripheral surface of the refrigerant flow pipe. The first watertight seal projection projects radially outward in an annular shape from the connector-side tubular portion toward the inner peripheral surface of the connector. The second watertight seal projection projects radially inward in an annular shape from the connector-side tubular portion toward the outer peripheral surface of the refrigerant flow pipe.

The refrigerant flow pipe is located in a through-hole formed through the case. When the sealing member is referred to as a first sealing member, a second sealing member is provided to make an airtight seal between the through-hole of the case and the refrigerant flow pipe at a position closer to the heat exchanger of the cooling device than the first sealing member.

The second sealing member includes a case-side tubular portion, a first airtight seal projection, and a second airtight seal projection. The case-side tubular portion is located between an inner peripheral surface of the through-hole and the outer peripheral surface of the refrigerant flow pipe. The first airtight seal projection projects radially outward in an annular shape from the case-side tubular portion toward the inner peripheral surface of the through-hole. The second airtight seal projection projects radially inward in an annular shape from the case-side tubular portion toward the outer peripheral surface of the refrigerant flow pipe.

The first sealing member and the second sealing member are integrated, a through-hole is formed at a boundary portion of the first sealing member and the second sealing member, and the through-hole serves as a refrigerant discharging passage that connects a space between the first sealing member and the outer peripheral surface of the refrigerant flow pipe to the outside of the case.

BRIEF DESCRIPTION OF THE DRAWINGS

The above features of the present disclosure will be made clearer by the following detailed description, given referring to the appended drawings. In the accompanying drawings.

DETAILED DESCRIPTION OF THE PREFERRED EMBODIMENTS

Figure 1:
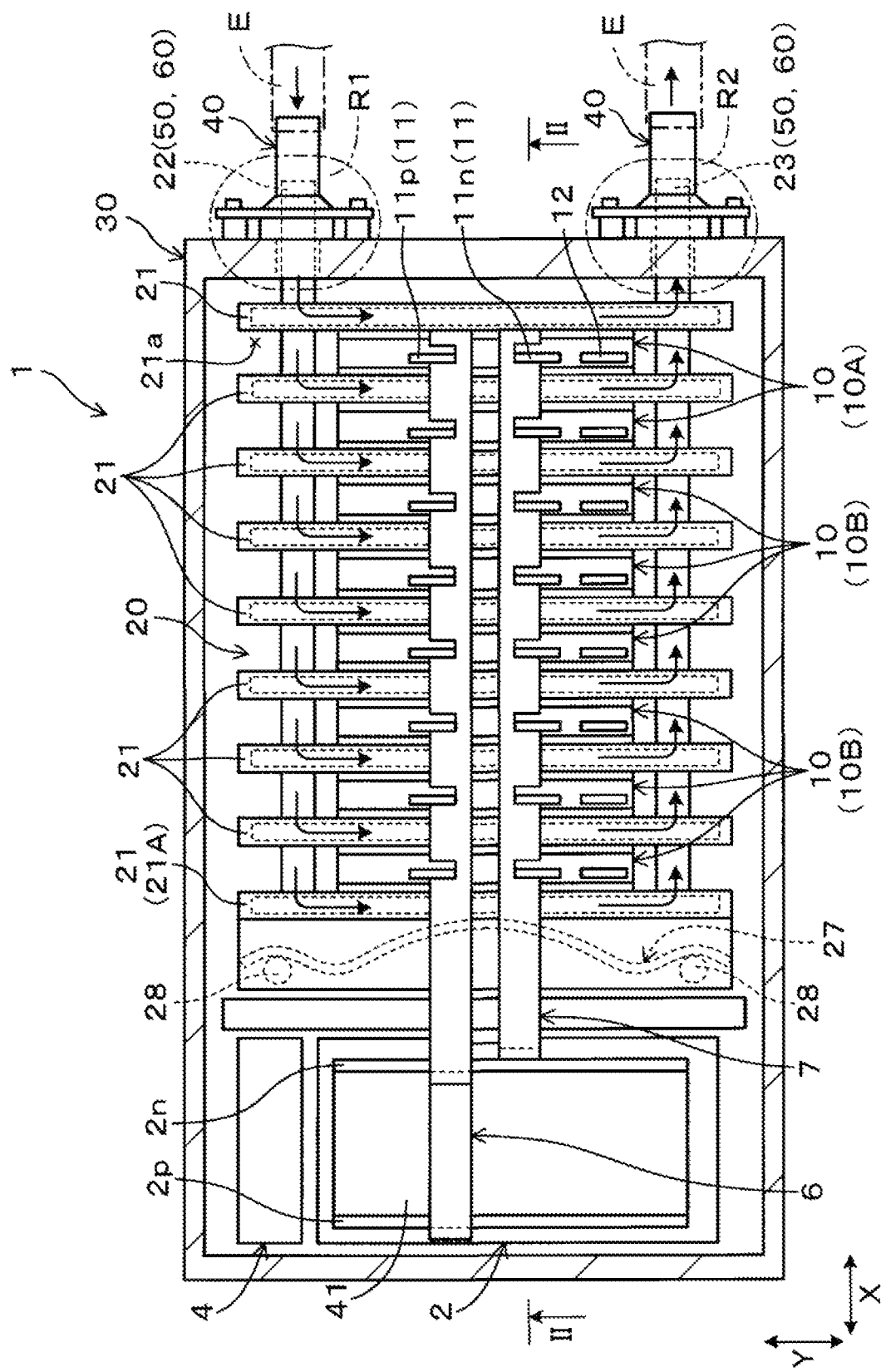
FIG. 1 shows a cross-sectional view of a power conversion device according to a first embodiment.

The connecting pipe of the power conversion device disclosed in JP 2017-51062 A includes a flange portion located outside the case and a tubular portion that extends from the flange portion into the case through a through-hole of the case. The connecting pipe is configured such that the flange portion abuts against the outer surface of the case via an airtight O-ring, which is a surface seal member, and the tubular portion abuts against the outer peripheral surface of the refrigerant outflow pipe via a watertight O-ring, which is a shaft seal member.

According to the above-mentioned power conversion device, a gap between the refrigerant outflow pipe and the tubular portion of the connecting pipe is sealed with the shaft seal member. This sealing structure prevents leakage of a refrigerant from the gap. However, with this sealing structure, since the shaft seal member is located inside the case, if the sealing performance of the shaft seal member is decreased or a problem occurs, it is difficult to prevent the refrigerant that has passed through the region sealed with the shaft seal member from flowing into the case.

The present disclosure is intended to provide a power conversion device that prevents a refrigerant of a cooling device from flowing into a case that accommodates semiconductor modules.

One aspect of the present disclosure provides a power conversion device that includes a semiconductor module, a cooling device, a case, a connector, and a sealing member.

The semiconductor module includes a switching element. The cooling device includes a heat exchanger capable of exchanging heat with the semiconductor module, a lead-in pipe that introduces a refrigerant to the heat exchanger, and a discharge pipe that discharges the refrigerant from the heat exchanger. The case accommodates the semiconductor module and the cooling device. The connector is connected to a refrigerant flow pipe, which is at least one of the lead-in pipe and the discharge pipe of the cooling device on an outside of the case. The sealing member makes a watertight seal between the refrigerant flow pipe and the connector.

The sealing member includes a connector-side tubular portion, a first watertight seal projection, and a second watertight seal projection. The connector-side tubular portion is located between an inner peripheral surface of the connector and an outer peripheral surface of the refrigerant flow pipe. The first watertight seal projection projects radially outward in an annular shape from the connector-side tubular portion toward the inner peripheral surface of the connector. The second watertight seal projection projects radially inward in an annular shape from the connector-side tubular portion toward the outer peripheral surface of the refrigerant flow pipe.

The refrigerant flow pipe is located in a through-hole formed through the case. When the sealing member is referred to as a first sealing member, a second sealing member is provided to make an airtight seal between the through-hole of the case and the refrigerant flow pipe at a position closer to the heat exchanger of the cooling device than the first sealing member.

The second sealing member includes a case-side tubular portion, a first airtight seal projection, and a second airtight seal projection. The case-side tubular portion is located between an inner peripheral surface of the through-hole and the outer peripheral surface of the refrigerant flow pipe. The first airtight seal projection projects radially outward in an annular shape from the case-side tubular portion toward the inner peripheral surface of the through-hole. The second airtight seal projection projects radially inward in an annular shape from the case-side tubular portion toward the outer peripheral surface of the refrigerant flow pipe.

The first sealing member and the second sealing member define a gap therebetween, and the gap serves as a refrigerant discharging passage that connects a space between the first sealing member and the outer peripheral surface of the refrigerant flow pipe to the outside of the case.

Another aspect of the present disclosure provides a power conversion device that includes a semiconductor module, a cooling device, a case, a connector, and a sealing member.

The semiconductor module includes a switching element. The cooling device includes a heat exchanger capable of exchanging heat with the semiconductor module, a lead-in pipe that introduces a refrigerant to the heat exchanger, and a discharge pipe that discharges the refrigerant from the heat exchanger. The case accommodates the semiconductor module and the cooling device. The connector is connected to a refrigerant flow pipe, which is at least one of the lead-in pipe and the discharge pipe of the cooling device on an outside of the case. The sealing member makes a watertight seal between the refrigerant flow pipe and the connector.

The sealing member includes a connector-side tubular portion, a first watertight seal projection, and a second watertight seal projection. The connector-side tubular portion is located between an inner peripheral surface of the connector and an outer peripheral surface of the refrigerant flow pipe. The first watertight seal projection projects radially outward in an annular shape from the connector-side tubular portion toward the inner peripheral surface of the connector. The second watertight seal projection projects radially inward in an annular shape from the connector-side tubular portion toward the outer peripheral surface of the refrigerant flow pipe.

The refrigerant flow pipe is located in a through-hole formed through the case. When the sealing member is referred to as a first sealing member, a second sealing member is provided to make an airtight seal between the through-hole of the case and the refrigerant flow pipe at a position closer to the heat exchanger of the cooling device than the first sealing member.

The second sealing member includes a case-side tubular portion, a first airtight seal projection, and a second airtight seal projection. The case-side tubular portion is located between an inner peripheral surface of the through-hole and the outer peripheral surface of the refrigerant flow pipe. The first airtight seal projection projects radially outward in an annular shape from the case-side tubular portion toward the inner peripheral surface of the through-hole. The second airtight seal projection projects radially inward in an annular shape from the case-side tubular portion toward the outer peripheral surface of the refrigerant flow pipe.

The first sealing member and the second sealing member are integrated, a through-hole is formed at a boundary portion of the first sealing member and the second sealing member, and the through-hole serves as a refrigerant discharging passage that connects a space between the first sealing member and the outer peripheral surface of the refrigerant flow pipe to the outside of the case.

In the above-mentioned power conversion device, the heat exchanger of the cooling device is capable of exchanging heat with the semiconductor modules each including the switching element. The connector is connected to the refrigerant flow pipe, which is at least one of the lead-in pipe and the discharge pipe of the cooling device, on the outside of the case. When the connector is connected to the refrigerant flow pipe, the first watertight seal projection of the sealing member abuts against the inner peripheral surface of the connector, and the second watertight seal projection of the sealing member abuts against the outer peripheral surface of the refrigerant flow pipe, so that a watertight seal is made between the refrigerant flow pipe and the connector.

In this aspect, the sealing member is configured such that the first watertight seal projection and the second watertight seal projection project from the connector-side tubular portion in opposite directions from each other. Thus, the first watertight seal projection is pressed against the inner peripheral surface of the connector, and the second watertight seal projection is pressed against the outer peripheral surface of the refrigerant flow pipe to make a watertight seal, and both the first watertight seal projection and the second watertight seal projection are supported by the connector-side tubular portion. Such a sealing member is superior in the watertight sealing performance between the refrigerant flow pipe and the connector.

Additionally, the sealing member is intended to make a watertight seal between the refrigerant flow pipe and the connector on the outside of the case. Thus, even if the watertight sealing performance of the sealing member is decreased or a problem occurs, the refrigerant that has passed through the region sealed by the first watertight seal projection of the sealing member and the region sealed by the second watertight seal projection directly flows to the outside of the case without flowing into the case.

As described above, the above aspect provides a power conversion device that prevents a refrigerant of a cooling device from flowing into a case that accommodates semiconductor modules.

Hereinafter, a power conversion device according to an embodiment will be described with reference to the drawings. The power conversion device is mounted on a vehicle such as an electric car and a hybrid car and is configured as a vehicle-mounted power conversion device that converts power between DC power and AC power.

In the present description, unless otherwise specified in particular, a first direction in which cooling pipes of a cooling device that are located in parallel to each other are stacked is indicated by an arrow X, a second direction in which the cooling pipes extend is indicated by an arrow Y, and a third direction orthogonal to both the first direction and the second direction is indicated by an arrow Z.

First Embodiment

Figure 2:
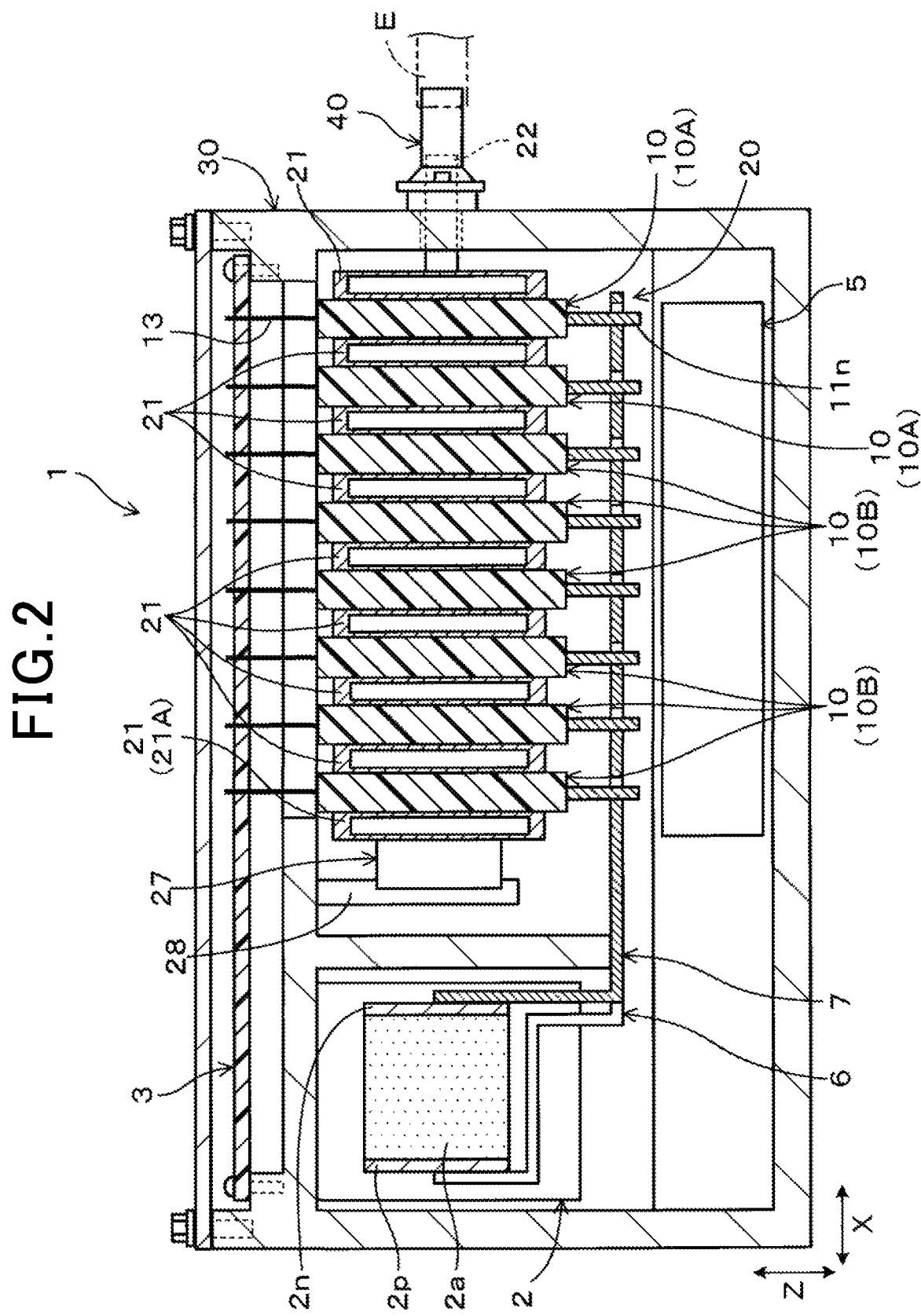
FIG. 2 shows a cross-sectional view taken along line II-II of FIG. 1 as viewed in the direction of arrows.

As shown in FIGS. 1 and 2, a power conversion device 1 according to a first embodiment generally includes semiconductor modules 10, a cooling device 20, and a case 30.

The case 30 is a metal housing that accommodates the semiconductor modules 10, the cooling device 20, and other components. The components include a capacitor 2, a control substrate 3, a reactor 4, and a DC-DC converter 5.

The capacitor 2 includes a capacitor element 2a and a pair of metal electrodes 2p and 2n. The metal electrode 2p is electrically connected to a positive terminal 11p of switching elements 11 included in each semiconductor module 10 through a metal bus bar 6. The metal electrode 2n is electrically connected to a negative terminal 11n of the switching elements 11 of each semiconductor module 10 through a metal bus bar 7.

The cooling device 20 functions to cool the semiconductor modules 10 using a cooling medium (hereinafter, simply referred to as a refrigerant). The cooling device 20 is a stack-type cooling device and includes cooling pipes 21, which are stacked together with the semiconductor modules 10. The cooling pipes 21 are stacked in the first direction X and are located parallel to each other with spaces 21a provided in between. The semiconductor modules 10 are located in the spaces 21a, respectively.

The cooling pipes 21 extend in the second direction Y, and the cross-sectional shape in the first direction X (the cross-sectional shape on the plane specified by the first direction X and the third direction Z) is rectangular. The cooling pipes 21 are connected in parallel to a lead-in pipe 22 and a discharge pipe 23. The cooling pipes 21 are configured as a heat exchanger that is capable of exchanging heat with the semiconductor modules 10. For this reason, the cooling pipes 21 are preferably formed of a material having high thermal conductivity, for example, a metal material such as aluminum.

The cooling pipes 21 include an outer cooling pipe 21A, which is pressed rightward of FIG. 1 by a compression leaf spring 27. The leaf spring 27 is supported by support pins 28 secured to the case 30. Since the leaf spring 27 presses the outer cooling pipe 21A, the cooling pipes 21 and the semiconductor modules 10 abut against each other under pressure in the first direction X.

Note that, the present embodiment exemplifies a case in which nine cooling pipes 21 are stacked in the first direction X, and the semiconductor modules 10 are respectively located in eight spaces 21a formed by the nine cooling pipes 21. However, the number of the semiconductor modules 10 and the number of the cooling pipes 21 are not limited to this and can be changed as required.

The lead-in pipe 22 and the discharge pipe 23 both extend in the first direction X, which is the stacking direction of the cooling pipes 21, and are secured to the case 30 at a first region R1 and a second region R2 with connectors 40. External pipes E such as rubber hoses are connected to the connectors 40. The lead-in pipe 22 and the discharge pipe 23 are preferably made of the same material as the cooling pipes 21 and are preferably made of, for example, a metal material such as aluminum.

The lead-in pipe 22 is for introducing a refrigerant into the cooling pipes 21, and the discharge pipe 23 is for discharging the refrigerant from the cooling pipes 21. Thus, the refrigerant introduced through the lead-in pipe 22 flows in parallel through the cooling pipes 21 in the second direction. When flowing through the refrigerant flow passage in each cooling pipe 21, the refrigerant cools the semiconductor modules 10 located on both sides of the cooling pipe 21 in the first direction X and is discharged through the discharge pipe 23.

A typical refrigerant includes water in which ethylene glycol-based antifreeze is mixed, a natural refrigerant such as water and ammonia, a fluorocarbon-based refrigerant such as Fluorinert, a Freon-based refrigerant such as HCFC123 and HFC134a, an alcohol-based refrigerant such as methanol and alcohol, and a ketone-based refrigerant such as acetone.

Figure 3:
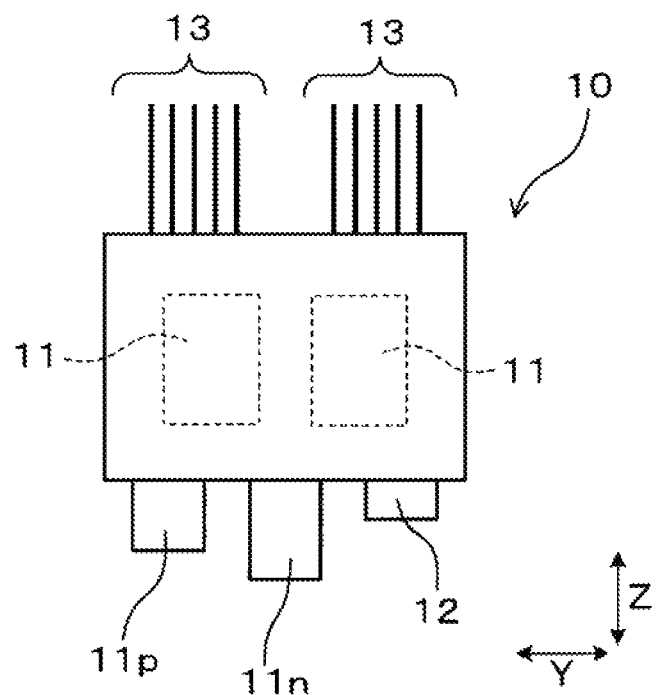
FIG. 3 shows a front view of a semiconductor module in FIG. 1.

As shown in FIG. 3, the semiconductor modules 10 are 2-in-1 modules each including two switching elements 11 in the module body. The semiconductor modules 10 each include a pair of electrode terminals, which are the positive terminal 11p and the negative terminal 11n, an output terminal 12, which is connected to a positive electrode of an auxiliary battery, which will be described below (an auxiliary battery B2 in FIG. 4), and control terminals 13, which are connected to a control circuit on the control substrate 3 that drives the switching elements 11.

Figure 4:
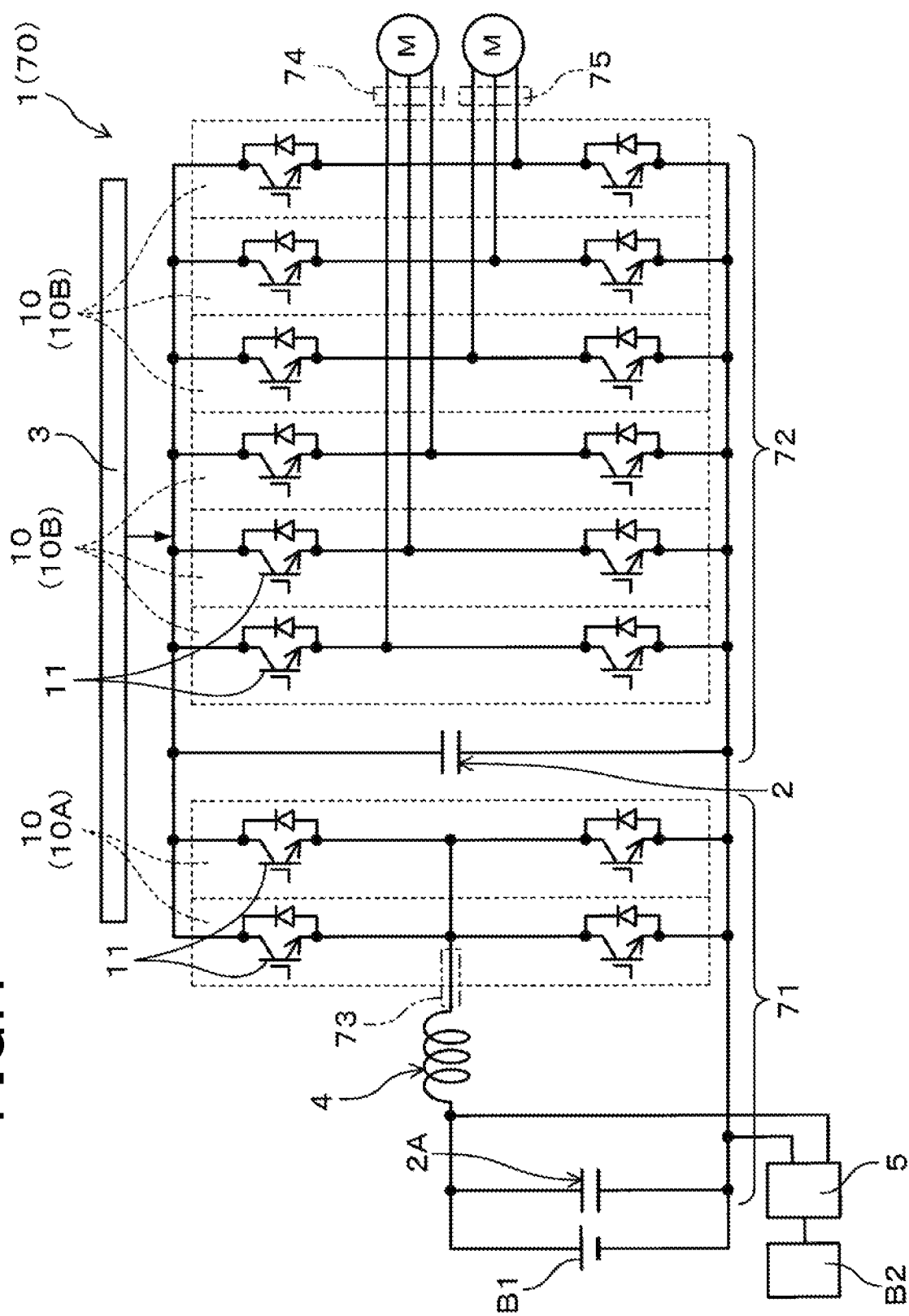
FIG. 4 shows an inverter circuit diagram of the power conversion device according to the first embodiment.

As shown in FIG. 4, the power conversion device 1 includes an inverter circuit 70, which is a power conversion circuit that converts DC power supplied from a DC power supply B1 to AC power. In the inverter circuit 70, the semiconductor modules 10 are electrically connected to the control substrate 3, and the control substrate 3 controls the switching operation (ON/OFF operation) of the semiconductor modules 10. The control substrate 3 is secured to the case 30 as shown in FIG. 2.

In the present embodiment, a capacitor 2A, the reactor 4, and two semiconductor modules 10A constitute a booster 71 of the inverter circuit 70, which is the power conversion circuit. The booster 71 functions to boost the voltage of the DC power supply B1 by the switching operation (ON/OFF operation) of the semiconductor modules 10A.

The capacitor 2A is for removing a noise current included in the current supplied from the DC power supply B1 and is also referred to as a filter capacitor. Like the capacitor 2 described above, the capacitor 2A is configured as a capacitor including a film capacitor element. The reactor 4 is a passive element that uses an inductor.

In the meantime, the capacitor 2 and six semiconductor modules 10B configure a converting section 72 of the inverter circuit 70, which is the power conversion circuit.

The converting section 72 functions to convert the DC power that has been boosted by the booster 71 to AC power by the switching operation (ON/OFF operation) of the semiconductor modules 10B.

The capacitor 2 is for smoothing the DC power boosted by the booster 71 and is also referred to as a smoothing capacitor. The AC power obtained by the converting section 72 drives three-phase alternating motors M for moving the vehicle.

The DC-DC converter 5 is connected to the DC power supply B1. The DC-DC converter 5 is used to lower the voltage of the DC power supply B1 and charge the auxiliary battery B2 that has a lower voltage than the DC power supply B1. The auxiliary battery B2 is used as a power supply for a variety of devices mounted on a vehicle.

The current flowing through the booster 71 is detected by a current sensor 73. The current flowing between the converting section 72 and the three-phase alternating motors M is detected by current sensors 74 and 75. The current sensors 73, 74, and 75 are electrically connected to the control substrate 3, and detection information by the current sensors 73, 74, and 75 is transmitted to the control substrate 3.

Figure 5:
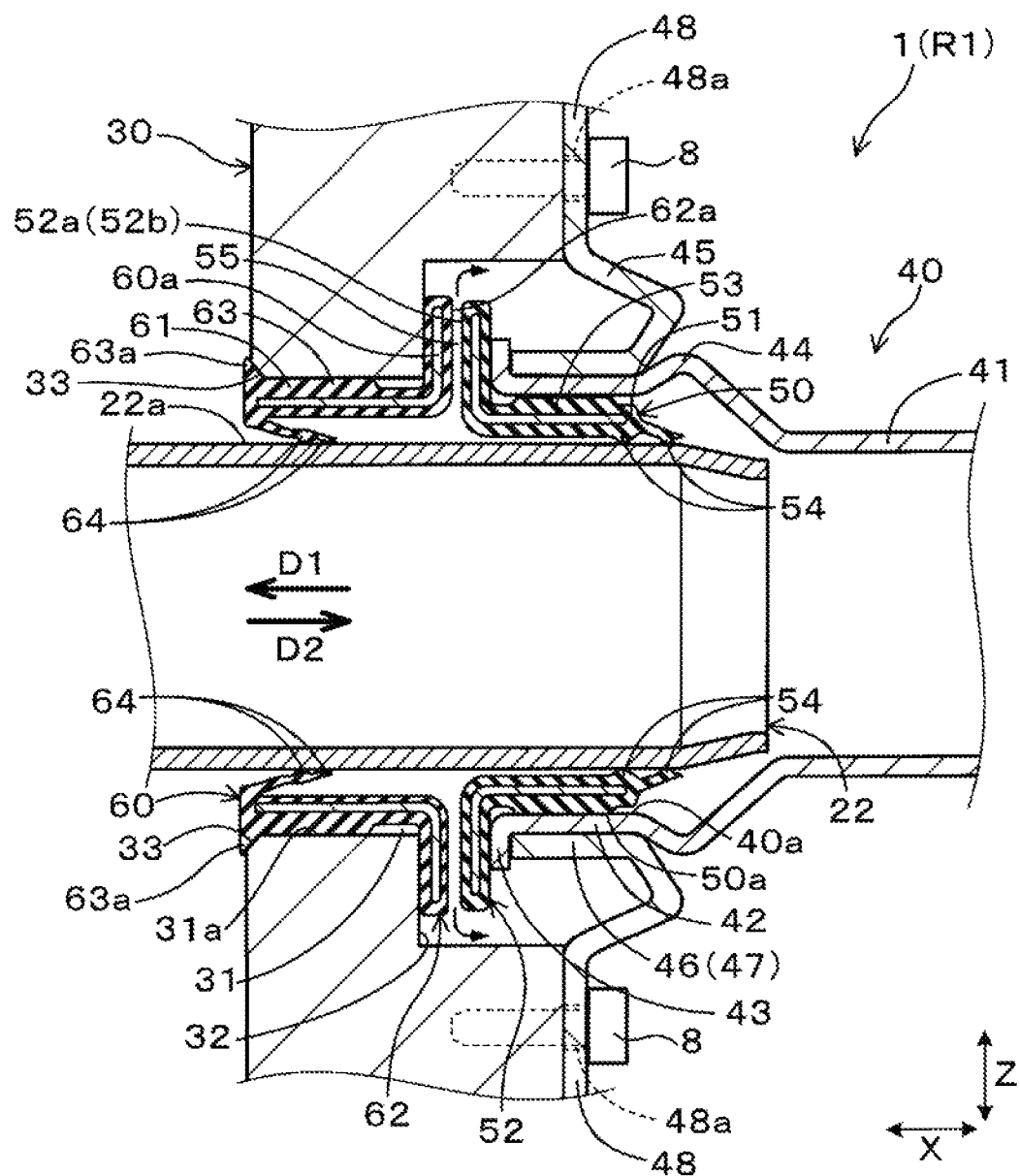
FIG. 5 shows a cross-sectional view of a first region in FIG. 1.

As shown in FIG. 5, the power conversion device 1 includes the connectors 40, a first sealing member 50, and a second sealing member 60.

The lead-in pipe 22, which is the refrigerant flow pipe, is inserted in a through-hole 31 formed through the case 30 so that the distal end section projects outside the case 30. The lead-in pipe 22 is configured to be connected to one of the connectors 40 on the outside of the case 30 (refer to the first region R1 in FIG. 1). The first sealing member 50 seals between the lead-in pipe 22 and the associated connector 40.

The connector 40 includes a tubular pipe portion 41, which communicates with the lead-in pipe 22, and a flange portion 45, which is secured to the case 30 with fastening members 8. The pipe portion 41 and the flange portion 45 are both formed of a metal material and are joined as one unit. Thus, the connector 40 is made of a metal material. The metal material of the connector 40 may typically be a stainless-steel material that has high corrosion resistance against the refrigerant.

The pipe portion 41 includes an inner tube 42, which has an inner diameter greater than the outer diameter of the lead-in pipe 22, a disk-like projection 43 that projects radially outward from the inner tube 42, and a projection 44 that projects radially outward from the position on the opposite side of the inner tube 42 from the projection 43. The distal end section of the lead-in pipe 22 is inserted inside the inner tube 42 of the pipe portion 41. One of the external pipes E (refer to FIG. 1) that is to communicate with the lead-in pipe 22 is connected to the pipe portion 41. Thus, the pipe portion 41 virtually forms the connector 40.

The flange portion 45 includes a cylindrical outer tube 46, which is located on the outer periphery of the inner tube 42 of the pipe portion 41, and a disk-like flange portion 48, which extends radially outward from the outer tube 46. The space in the outer tube 46 forms an insertion hole 47 in which the inner tube 42 of the pipe portion 41 is inserted. Thus, the outer tube 46 is an opening edge portion of the insertion hole 47. The flange portion 48 includes mounting holes 48a in which the shafts of the fastening members 8 are inserted.

The outer tube 46 is sandwiched between the projection 43 and the projection 44, which are formed on the pipe portion 41 adjacent to the outer tube 46 and project radially outward. In this state, the projection 43 and the projection 44 restrict the pipe portion 41 and the flange portion 45 from moving relative to each other in the first direction X, which is the axial direction of the pipe portion 41.

The first sealing member 50 includes a connector-side tubular portion, which is a tubular portion 51, a disk-like flange portion 52, which extends radially outward from the tubular portion 51, a first watertight seal projection, which is a projection 53, and second watertight seal projections, which are projections 54. Hereinafter, the first sealing member 50 is simply referred to as the "sealing member 50".

The sealing member 50 includes a metal core material 50a, which forms a frame portion, and a plastic portion, which covers around the core material 50a with a plastic material. The projections 53 and 54 of the sealing member 50 are formed of the plastic portion around the core material 50a.

The sealing member 50 is inserted in the connector 40 in an insertion direction D2 and, in this state, the sealing member 50 is mounted on the case 30 together with the connector 40.

The tubular portion 51 of the sealing member 50 is located between an inner peripheral surface 40a of the connector 40 and an outer peripheral surface 22a of the lead-in pipe 22. The flange portion 52 is located such that the projection 43 of the pipe portion 41 is sandwiched between the flange portion 52 and the flange portion 45 in the first direction X.

The projection 53 is formed as an annular projection that projects radially outward in an annular shape from the tubular portion 51 toward the inner peripheral surface 40a of the connector 40. The cross-sectional shape of the projection 53 on the plane determined by the first direction X and the third direction Z is substantially a trapezoid the width of which in the first direction X gradually decreases radially outward. Thus, the projection 53 forms a trapezoidal lip seal structure. The projection 53 abuts against the inner peripheral surface 40a of the connector 40. At this time, the projection 53 is compressed by the inner peripheral surface 40a of the connector 40 and elastically deforms, so that watertight sealing performance is exerted.

The projections 54 are formed as annular projections that project radially inward in an annular shape from the tubular portion 51 toward the outer peripheral surface 22a of the lead-in pipe 22. The projections 54 are generally provided on an arm portion that extends rightward in FIG. 5 from the section corresponding to the right distal end section of the core material 50a. The cross-sectional shape of the arm portion on the plane determined by the first direction X and the third direction Z is shaped such that two annular projections 54 are spaced apart in the first direction X. Thus, the two projections 54 form a double lip seal structure.

When the two projections 54 abut against the outer peripheral surface 22a of the lead-in pipe 22, the projections 54 are compressed by the outer peripheral surface 22a of the lead-in pipe 22 and elastically deform, so that watertight sealing performance is exerted. Since the flexible plastic arm portion is long, the arm portion elastically deforms in accordance with the eccentricity of the lead-in pipe 22, so that the projections 54 can maintain high watertight sealing performance. The projections 54 shaped as above have a good ability to deform in accordance with the eccentricity of the lead-in pipe 22.

The projection 53 and the projections 54 are all shaped as if the projecting portion is extended annularly in the circumferential direction and extend on the plane determined by the second direction Y and the third direction Z.

In the present embodiment, one projection 53 is located on the outer surface of the tubular portion 51, and two projections 54 are located on the inner surface of the tubular portion 51 with a gap in the first direction X.

The number, position, and shape of the projection 53 and the projections 54 are not limited to those mentioned above and can be changed as required. That is, the number of the projection 53 may be the same as the number of the projection 54, or the number of the projection 53 may differ from the number of the projection 54. The cross-sectional shape of the projection 53 may be a rectangle the width of which in the first direction X is generally constant. To improve the sealing performance, the number of the projections 53 and 54 is preferably increased.

The second sealing member 60 is provided at a position closer to the cooling pipes 21 of the cooling device 20 than the sealing member 50 in the first direction X to seal between the through-hole 31 of the case 30 and the lead-in pipe 22. The second sealing member 60 is configured as a separate member from the sealing member 50.

The second sealing member 60 includes a case-side tubular portion, which is a tubular portion 61, a disk-like flange portion 62, which extends radially outward from the tubular portion 61, a first airtight seal projection, which is a projection 63, and second airtight seal projections, which are projections 64. Hereinafter, the second sealing member 60 is simply referred to as the "sealing member 60".

The sealing member 60 includes, like the sealing member 50, a metal core material 60a, which forms a frame portion, and a plastic portion, which covers around the core material 60a with a plastic material. The projections 63 and 64 of the sealing member 60 are formed of the plastic portion around the core material 60a.

The sealing member 60 is mounted on the case 30 by being inserted in the case 30 in an insertion direction D1. The tubular portion 61 of the sealing member 60 is located between an inner peripheral surface 31a of the through-hole 31 of the case 30 and the outer peripheral surface 22a of the lead-in pipe 22. The flange portion 62 is located to abut against an end surface 32 of the case 30 in the first direction X from the outside.

Note that, in the present embodiment, the insertion direction D1 of the sealing member 60 corresponds to a removing direction D1 of the sealing member 50. Additionally, a removing direction D2 of the sealing member 60 corresponds to the insertion direction D2 of the sealing member 50.

Given the circumstances, the flange portion 62 of the sealing member 60 is provided to overlap the flange portion 52 of the sealing member 50 in the removing direction D1 of the sealing member 50. In this case, the dimension of the flange portion 62 is preferably set to overlap the flange portion 52 of the sealing member 50 in the removing direction D1. Thus, the flange portion 62 serves as a first sealing member restricting section, which restricts the movement of the sealing member 50 in the removing direction D1. As a result, the sealing member 50 becomes unlikely to fall out, and the watertight sealing performance of the sealing member 50 is maintained.

The projection 63 is formed as an annular projection that projects radially outward in an annular shape from the tubular portion 61 toward the inner peripheral surface 31a of the through-hole 31 of the case 30. The cross-sectional shape of the projection 63 on the plane determined by the first direction X and the third direction Z is substantially a trapezoid the width of which in the first direction X gradually decreases radially outward. Thus, the projection 63 forms a trapezoidal lip seal structure. The projection 63 abuts against the inner peripheral surface 31a of the through-hole 31. At this time, the projection 63 is compressed by the inner peripheral surface 31a of the through-hole 31 and elastically deforms, so that airtight sealing performance is exerted.

Additionally, when the sealing member 60 is inserted in the case 30, part of the projection 63 protrudes radially outward, forming a hook 63a. The hook 63a is caught on a locking portion 33 of the case 30 and functions to prevent the sealing member 60 from falling out. The locking portion 33 of the case 30 is chamfered where the corner is cut at an angle. The locking portion 33 may be provided annularly in the circumferential direction or may be provided partially in the circumferential direction.

The projections 64 are formed as annular projections that project radially inward in an annular shape from the tubular portion 61 toward the outer peripheral surface 22a of the lead-in pipe 22. The projections 64 are generally provided on an arm portion that extends rightward in FIG. 5 from the section corresponding to the left distal end section of the core material 60a. The cross-sectional shape of the arm portion on the plane determined by the first direction X and the third direction Z is shaped such that two annular projections 64 are spaced apart in the first direction X. Thus, the two projections 64 form a double lip seal structure.

When the two projections 64 abut against the outer peripheral surface 22a of the lead-in pipe 22, the projections 64 are compressed by the outer peripheral surface 22a of the lead-in pipe 22 and elastically deform, so that airtight sealing performance is exerted. Since the flexible plastic arm portion is long, the arm portion elastically deforms in accordance with the eccentricity of the lead-in pipe 22, so that the projections 64 can maintain high airtight sealing performance. The projections 64 shaped as above have a good ability to deform in accordance with the eccentricity of the lead-in pipe 22.

The projection 63 and the projections 64 are all shaped as if the projecting portion is extended annularly in the circumferential direction and extend on the plane determined by the second direction Y and the third direction Z.

In the present embodiment, one projection 63 is located on the outer surface of the tubular portion 61, and two projections 64 are located on the inner surface of the tubular portion 61 with a gap in the first direction X. Additionally, the two projections 63 overlap the two projections 64 in the third direction Z, respectively.

The number, position, and shape of the projection 63 and the projections 64 are not limited to those mentioned above and can be changed as required. That is, the number of the projection 63 may be the same as the number of the projection 64, or the number of the projection 63 may differ from the number of the projection 64. The cross-sectional shape of the projection 63 may be a rectangle the width of which in the first direction X is generally constant. To improve the sealing performance, the number of the projections 63 and 64 is preferably increased.

When the connector 40 is formed of a material that has higher corrosion resistance against the refrigerant than the lead-in pipe 22, to enhance the sealing performance of the lead-in pipe 22 having low corrosion resistance, the number of the projections 54 may be greater than the number of the projection 53 on the sealing member 50, or the number of the projections 64 may be greater than the number of the projection 63 on the sealing member 60.

A gap 55 in the first direction X is formed between a first opposing surface 52a of the flange portion 52 of the sealing member 50 and a second opposing surface 62a of the flange portion 62 of the sealing member 60. The first opposing surface 52a and the second opposing surface 62a face each other in the first direction X. Thus, the gap 55 forms a refrigerant discharging passage that connects the space between the sealing member 50 and the outer peripheral surface 22a of the lead-in pipe 22 to the outside of the case 30. The gap 55 functions to discharge the refrigerant to the outside of the case 30 when the refrigerant flows into the space on the outer peripheral surface 22a of the lead-in pipe 22. The gap 55 prevents the refrigerant from flowing to the inside of the case 30.

Figure 6:
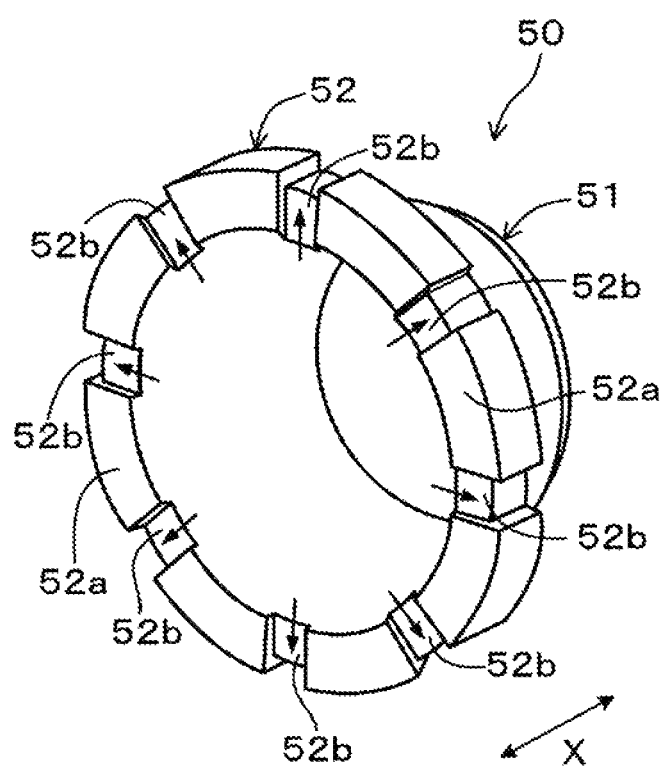
FIG. 6 shows a perspective view of a first sealing member in FIG. 5 as viewed from a flange portion.

As shown in FIG. 6, the first opposing surface 52a of the sealing member 50 includes refrigerant discharging grooves 52b, which are recessed in the axial direction, which is the first direction X. The refrigerant discharging grooves 52b are arranged at substantially equal intervals in the circumferential direction. The refrigerant discharging grooves 52b are provided to ensure that passages for allowing the refrigerant to flow are provided even when the first opposing surface 52a of the sealing member 50 and the second opposing surface 62a of the sealing member 60 abut against each other due to the pressure of the refrigerant. Thus, even when the gap 55 between the first opposing surface 52a and the second opposing surface 62a disappears, the refrigerant that has flowed into the space on the outer peripheral surface 22a of the lead-in pipe 22 can be discharged to the outside of the case 30 through the refrigerant discharging grooves 52b as shown by the arrows in FIG. 6.

Note that, the number and shape of the refrigerant discharging grooves 52b are not limited to those shown in FIG. 6 and can be changed as required. For example, the number of the refrigerant discharging groove 52b may be one. Furthermore, instead of or in addition to the refrigerant discharging grooves 52b of the sealing member 50, refrigerant discharging grooves corresponding to the refrigerant discharging grooves 52b may be provided on the second opposing surface 62a of the sealing member 60. In other words, the refrigerant discharging grooves may be provided on at least one of the first opposing surface 52a of the sealing member 50 and the second opposing surface 62a of the sealing member 60.

Figure 7:
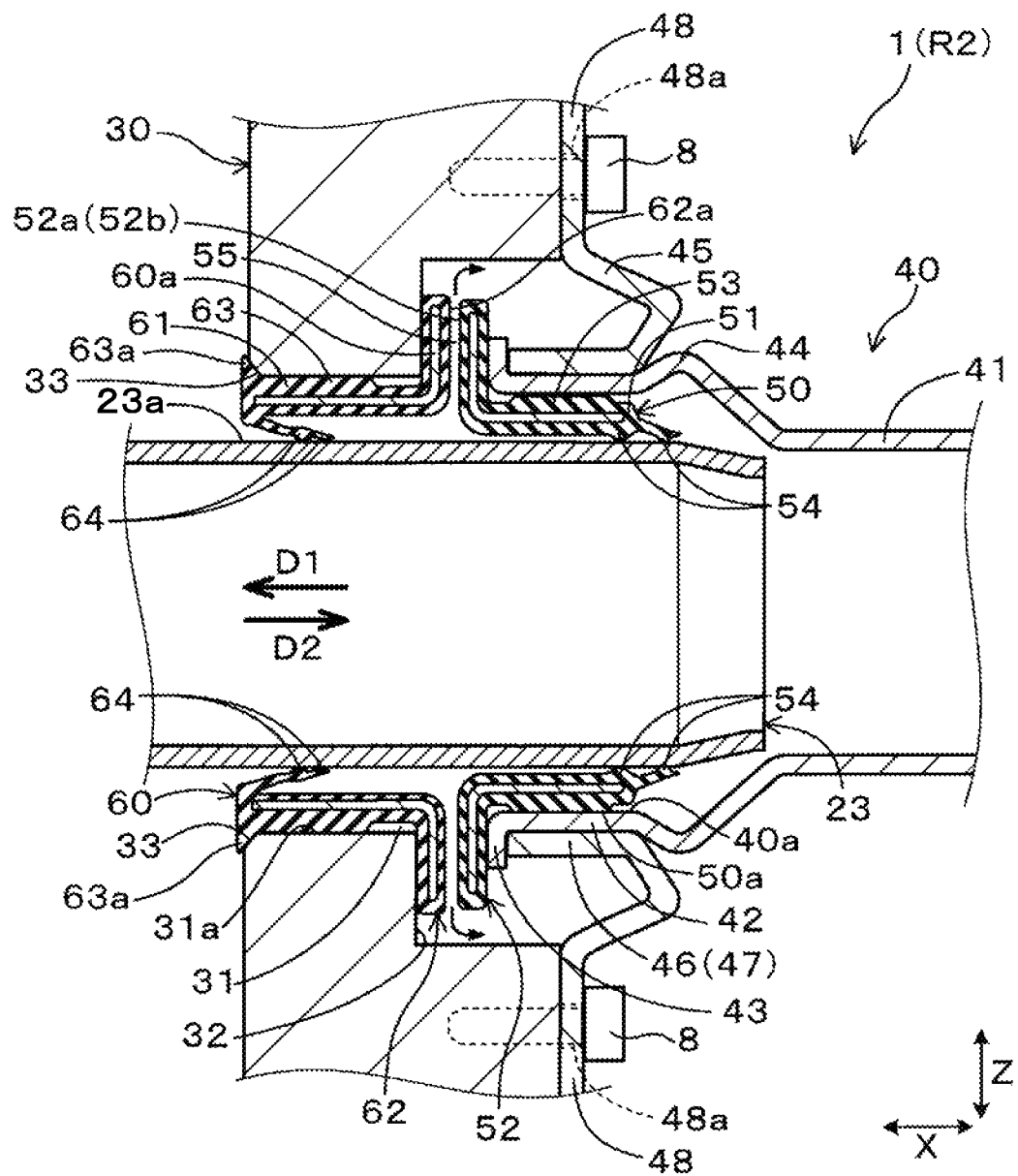
FIG. 7 shows a cross-sectional view of a second region in FIG. 1.

As shown in FIG. 7, like the lead-in pipe 22, the discharge pipe 23, which is the refrigerant flow pipe, is inserted in the through-hole 31 formed through the case 30, and the distal end section projects to the outside of the case 30. The discharge pipe 23 is configured to be connected to the connector 40 that is the same as the one used in the case of the lead-in pipe 22 on the outside of the case 30 (refer to the second region R2 in FIG. 1). The sealing member 50, which is the same as the one used in the case of the lead-in pipe 22, seals between the discharge pipe 23 and the connector 40.

The connector 40 is configured such that the tubular pipe portion 41 communicates with the discharge pipe 23. The inner tube 42 of the pipe portion 41 has an inner diameter greater than the outer diameter of the discharge pipe 23. The distal end section of the discharge pipe 23 is inserted inside the inner tube 42. The other one of the external pipes E (not shown, refer to FIG. 1) that is to communicate with the discharge pipe 23 is connected to the pipe portion 41.

The sealing member 50 and the sealing member 60 are the same as those used in the case of the lead-in pipe 22, and only the differences will be described.

The tubular portion 51 of the sealing member 50 is located between the inner peripheral surface 40a of the connector 40 and an outer peripheral surface 23a of the discharge pipe 23. the projection 53 of the sealing member 50 projects radially outward from the tubular portion 51 toward the inner peripheral surface 40a of the connector 40, and the projections 54 of the sealing member 50 project radially inward from the tubular portion 51 toward the outer peripheral surface 23a of the discharge pipe 23.

The tubular portion 61 of the sealing member 60 is located between the inner peripheral surface 31a of the through-hole 31 of the case 30 and the outer peripheral surface 23a of the discharge pipe 23. The projection 63 of the sealing member 60 projects radially outward from the tubular portion 61 toward the inner peripheral surface 31a of the through-hole 31 of the case 30, and the projections 64 of the sealing member 60 project radially inward from the tubular portion 61 toward the outer peripheral surface 23a of the discharge pipe 23.

The gap 55 formed between the sealing member 50 and the sealing member 60 forms a refrigerant discharging passage that connects the space on the outer peripheral surface 23a of the discharge pipe 23 to the outside of the case 30. The gap 55 functions to discharge the refrigerant to the outside of the case 30 when the refrigerant flows into the space on the outer peripheral surface 23a of the discharge pipe 23.

Next, the operation for connecting the connector 40 to the lead-in pipe 22, which projects from the case 30, will be described with reference to FIG. 8. This operation is the same as the operation for connecting the connector 40 to the discharge pipe 23, which projects from the case 30. Thus, only the operation regarding the lead-in pipe 22 will be described, and the operation regarding the discharge pipe 23 will be omitted.

Figure 8:
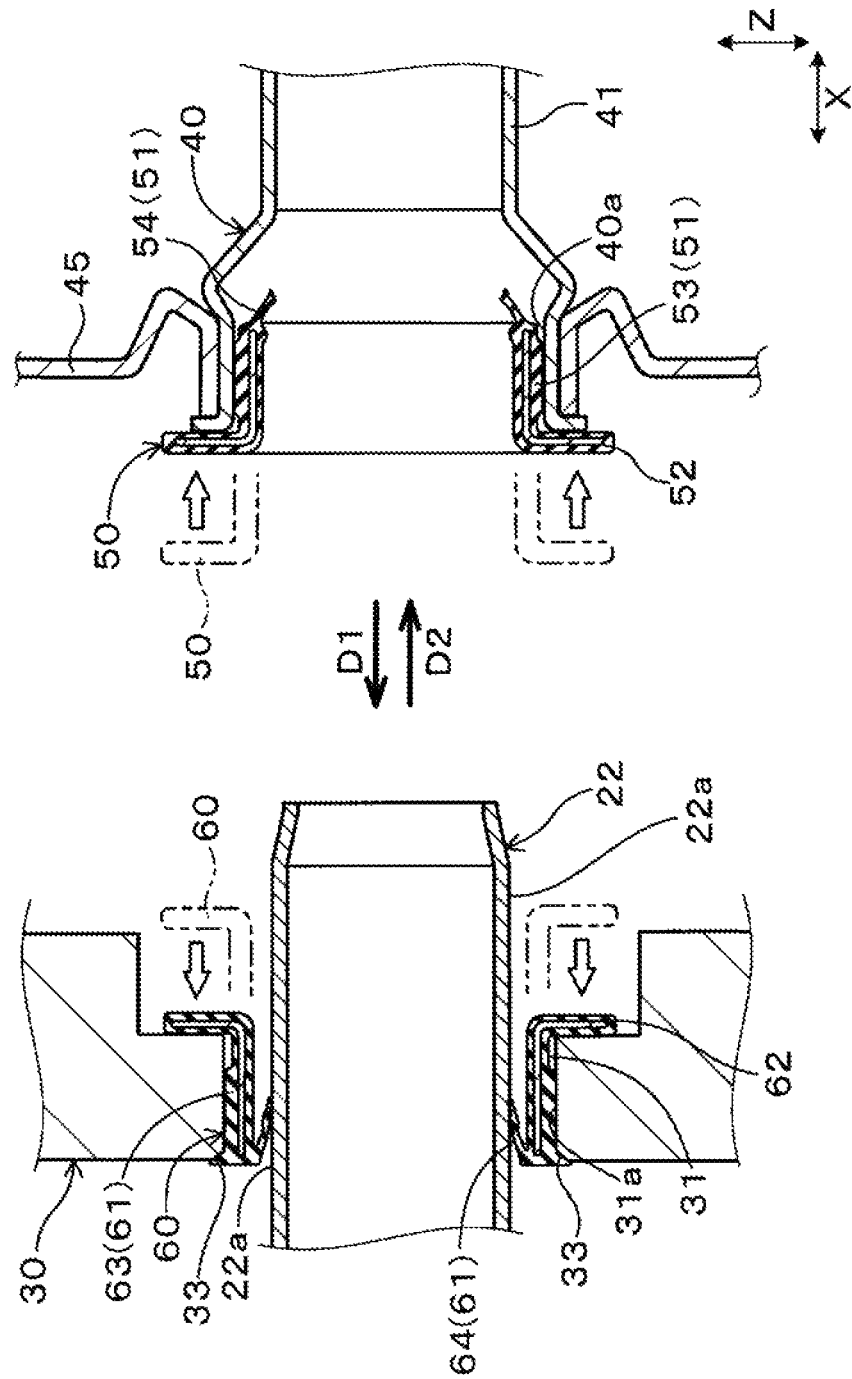
FIG. 8 shows a schematic diagram illustrating how a connector and a sealing member are assembled.

As shown in FIG. 8, before connecting the connector 40 to the lead-in pipe 22, which projects from the case 30, the sealing member 50 is previously mounted on the connector 40, and the sealing member 60 is previously mounted on the case 30.

The sealing member 50 is mounted on the connector 40 by pushing the tubular portion 51 that has been inserted in the connector 40 in the insertion direction D2 until the flange portion 52 abuts against the connector 40. At this time, the projection 53 of the sealing member 50 slides along the inner peripheral surface 40a of the connector 40.

The sealing member 60 is fitted to the lead-in pipe 22, and then the tubular portion 61 is inserted in the through-hole 31 of the case 30. The tubular portion 61 that has been inserted in the through-hole 31 is pushed in the insertion direction D1 until the flange portion 62 abuts against the case 30. In this manner, the sealing member 60 is mounted on the case 30. At this time, the projection 63 of the sealing member 60 slides along the inner peripheral surface 31a of the through-hole 31 of the case 30, and the projections 64 of the sealing member 60 slide along the outer peripheral surface 22a of the lead-in pipe 22.

At this time, when the sealing member 60 is pushed in the insertion direction D1, the hook 63a, which protrudes radially outward from the projection 63, is caught on the locking portion 33. Thus, the sealing member 60 is locked to the case 30. At this time, when the hook 63a of the projection 63 is caught on the locking portion 33 of the case 30, the locking portion 33 functions as a second sealing member restricting section, which restricts the movement of the sealing member 60 in the removing direction D2. Since the locking portion 33 is chamfered, it is advantageous in preventing damage to the sealing member 60.

After that, the case 30 and the connector 40 are brought close to each other, and the lead-in pipe 22 is inserted in the tubular portion 51 of the sealing member 50. At this time, the projections 54 of the sealing member 50 slide along the outer peripheral surface 22a of the lead-in pipe 22. The connector 40 is then fastened to the case 30 with the fastening members 8 inserted in the mounting holes 48a of the flange portion 45 (refer to FIG. 5).

Next, the operational advantages of the above-described first embodiment will be described.

In the above-mentioned power conversion device 1, the cooling pipes 21, which are the heat exchanger of the cooling device 20, are capable of exchanging heat with the semiconductor modules 10, which include the switching elements 11. The connectors 40 are connected to the lead-in pipe 22 and the discharge pipe 23 of the cooling device 20 outside the case 30.

When the connector 40 is connected to the lead-in pipe 22, the projection 53 of the sealing member 50 abuts against the inner peripheral surface 40a of the connector 40, and the projections 54 of the sealing member 50 abut against the outer peripheral surface 22a of the lead-in pipe 22. This makes a watertight seal between the lead-in pipe 22 and the connector 40. Additionally, when the connector 40 is connected to the discharge pipe 23, the projection 53 of the sealing member 50 abuts against the inner peripheral surface 40a of the connector 40, and the projections 54 of the sealing member 50 abut against the outer peripheral surface 23a of the discharge pipe 23. This makes a watertight seal between the discharge pipe 23 and the connector 40.

The sealing member 50 is configured such that the projection 53 and the projections 54 project from the tubular portion 51 in opposite directions from each other. Thus, the projection 53 is pressed against the inner peripheral surface 40a of the connector 40, and the projections 54 are pressed against the outer peripheral surface 22a of the lead-in pipe 22 for sealing while both the projection 53 and the projections 54 are supported by the tubular portion 51.

Similarly, the projection 53 is pressed against the inner peripheral surface 40a of the connector 40, and the projections 54 are pressed against the outer peripheral surface 23a of the discharge pipe 23 to make a watertight seal while both the projection 53 and the projections 54 are supported by the tubular portion 51.

The sealing member 50 configured as above is superior in the watertight sealing performance between the lead-in pipe 22 and the connector 40, and the watertight sealing performance between the discharge pipe 23 and the connector 40. Since the projection 53 and the projections 54 are provided at multiple positions in the first direction X, the length of the sealing region in first direction X is increased, which improves the watertight sealing performance compared with a sealing member such as an O-ring.

Additionally, the sealing member 50 is intended to seal between the connector 40 and each of the lead-in pipe 22 and the discharge pipe 23 on the outside of the case 30. Thus, even if the sealing performance of the sealing member 50 is decreased or a problem occurs, the refrigerant that has passed through the region sealed by the projection 53 of the sealing member 50 and the region sealed by the projections 54 of the sealing member 50 directly flows to the outside of the case 30 without flowing to the inside of the case 30.

As described above, the first embodiment provides the power conversion device 1 that prevents the refrigerant of the cooling device 20 from flowing into the case 30, which accommodates the semiconductor modules 10.

According to the above-mentioned power conversion device 1, when the sealing member 60 is mounted on the case 30 with the lead-in pipe 22, the projection 63 of the sealing member 60 abuts against the inner peripheral surface 31a of the through-hole 31 of the case 30, and the projections 64 of the sealing member 60 abut against the outer peripheral surface 22a of the lead-in pipe 22, so that an airtight seal is made between the through-hole 31 of the case 30 and the lead-in pipe 22.

Additionally, when the sealing member 60 is mounted on the case 30 with the discharge pipe 23, the projection 63 of the sealing member 60 abuts against the inner peripheral surface 31a of the through-hole 31 of the case 30, and the projections 64 of the sealing member 60 abut against the outer peripheral surface 23a of the discharge pipe 23, so that an airtight seal is made between the through-hole 31 of the case 30 and the discharge pipe 23.

The sealing member 60 is configured such that the projection 63 and the projections 64 project from the tubular portion 61 in opposite directions from each other. Thus, the projection 63 is pressed against the inner peripheral surface 31a of the through-hole 31, and the projections 64 are pressed against the outer peripheral surface 22a of the lead-in pipe 22 to make an airtight seal, and both the projection 63 and the projections 64 are supported by the tubular portion 61.

Similarly, the projection 63 is pressed against the inner peripheral surface 31a of the through-hole 31, the projections 64 are pressed against the outer peripheral surface 23a of the discharge pipe 23 to make an airtight seal, and both the projection 63 and the projections 64 are supported by the tubular portion 61.

The sealing member 60 configured as above is superior in the airtight sealing performance between the through-hole 31 and the lead-in pipe 22, and the airtight sealing performance between the through-hole 31 and the discharge pipe 23.

The power conversion device 1 superior in both the watertightness and airtightness is achieved by employing the configuration including the sealing member 50 and the sealing member 60.

According to the above-mentioned power conversion device 1, the flange portion 62 of the sealing member 60 overlaps the flange portion 52 of the sealing member 50 in the removing direction D1. Thus, the flange portion 62 of the sealing member 60 restricts the sealing member 50 mounted on the connector 40 from moving in the removing direction D1 due to, for example, the influence of the refrigerant pressure.

According to the above-mentioned power conversion device 1, since the locking portion 33 is provided on the case 30, the sealing member 60 mounted on the case 30 is restricted from moving in the removing direction D2 by the locking portion 33.

According to the above-mentioned power conversion device 1, since the gap 55 is provided between the sealing member 50 and the sealing member 60, the refrigerant that has flowed into the space on the outer peripheral surface 23a of the discharge pipe 23 is guided to the outside of the case 30 through the gap 55. Thus, by using the gap 55, the refrigerant that has passed through the region sealed by the projection 53 of the sealing member 50 and the region sealed by the projections 54 of the sealing member 50 is more reliably prevented from flowing into the case 30.

According to the above-mentioned power conversion device 1, using the connector 40 formed of a metal material increases the strength of the connector 40 itself.

According to the above-mentioned power conversion device 1, when, for example, a sealing member such as an O-ring is used, the use of the sealing member 50 and the sealing member 60 eliminates the need for preparing a separate member such as a pressure-resisting back-up ring that is commonly used with the O-ring. This prevents an increase in the number of components.

Note that, instead of using a step 22b of the lead-in pipe 22 and a step 23b of the discharge pipe 23 as the restricting section that restricts the movement of the sealing member 50 in the removing direction D1, a structure in which the section corresponding to the restricting section is provided on the case 30 or the sealing member 60 may be employed as a modification related to the above-described first embodiment in particular.

Additionally, in another modification, instead of using the locking portion 33 of the case 30 as the restricting section that restricts the movement of the sealing member 60 in the removing direction D2, the structure in which the section corresponding to the restricting section is provided on the lead-in pipe 22 and the discharge pipe 23 may be employed.

Furthermore, in another modification, the refrigerant discharging grooves 52b provided on the first opposing surface 52a of the sealing member 50 may be omitted as required.

Hereinafter, other embodiments related to the above-mentioned first embodiment will be described with reference to the drawings. In other embodiments, the same reference numerals are given to those components that are the same as the corresponding components of the first embodiment, and detailed explanations of the same components are omitted.

Second Embodiment

Figure 9:
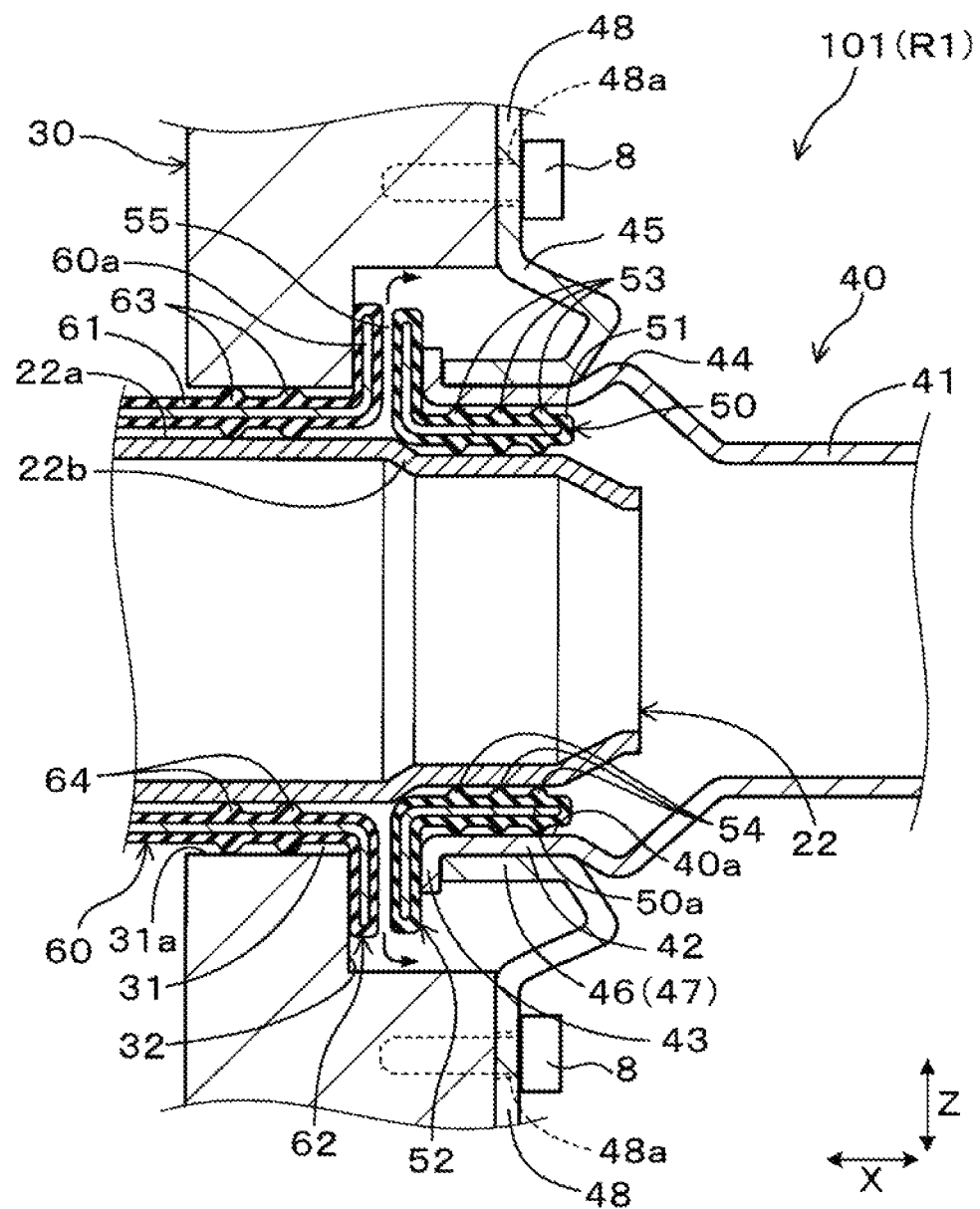
FIG. 9 shows a cross-sectional view of a power conversion device according to a second embodiment corresponding to FIG. 5.
Figure 10:
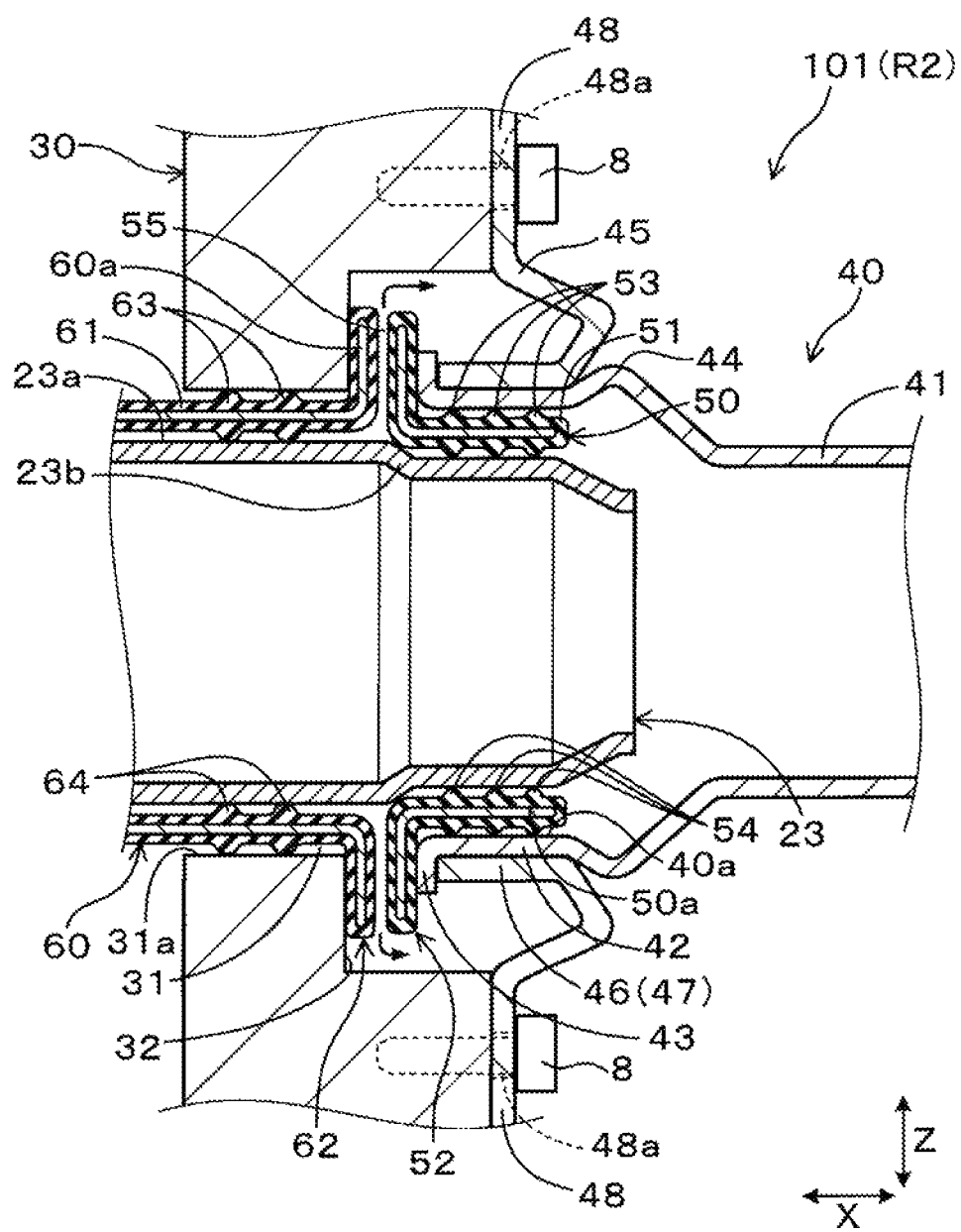
FIG. 10 shows a cross-sectional view illustrating the power conversion device according to the second embodiment corresponding to FIG. 7.

As shown in FIGS. 9 and 10, a power conversion device 101 according to a second embodiment differs from that of the first embodiment in the structure of each of the lead-in pipe 22, the discharge pipe 23, the case 30, the sealing member 50, and the sealing member 60.

Others are the same as the first embodiment.

As shown in FIG. 9, the lead-in pipe 22 has the step 22b in the first region R1 of the power conversion device 101. The step 22b serves as the first sealing member restricting section, which restricts the movement of the sealing member 50 in the removing direction D1. The step 22b is configured by the boundary portion between two tubes having different outer diameters relative to each other. The locking portion 33 of the case 30 is omitted.

The sealing member 50 includes three projections 53 located on the outer surface of the tubular portion 51 with intervals in the first direction X and three projections 54 located on the inner surface of the tubular portion 51 with intervals in the first direction X. Furthermore, the three projections 53 are aligned with the three projections 54 respectively in the third direction Z. The refrigerant discharging grooves 52b of the sealing member 50 are omitted.

The sealing member 60 includes two projections 63 located on the outer surface of the tubular portion 61 with intervals in the first direction X and two projections 64 located on the inner surface of the tubular portion 61 with intervals in the first direction X. Furthermore, the two projections 63 are aligned with the two projections 64 respectively in the third direction Z. As shown in FIG. 10, like the case of the lead-in pipe 22, the discharge pipe 23 includes the step 23b in the second region R2 of the power conversion device 101. The step 23b serves as the first sealing member restricting section, which restricts the movement of the sealing member 50 in the removing direction D1.

According to the power conversion device 101 of the second embodiment, the shape variations of the sealing member 50 and the sealing member 60 can be increased.

Furthermore, according to the power conversion device 101, by providing the lead-in pipe 22 with the step 22b and the discharge pipe 23 with the step 23b, the sealing member 50 mounted on the connector 40 is restricted from moving in the removing direction D1 due to, for example, the influence of the refrigerant pressure using the steps 22b and 23b.

Additionally, the same operational advantages as the first embodiment are achieved.

Third Embodiment

Figure 11:
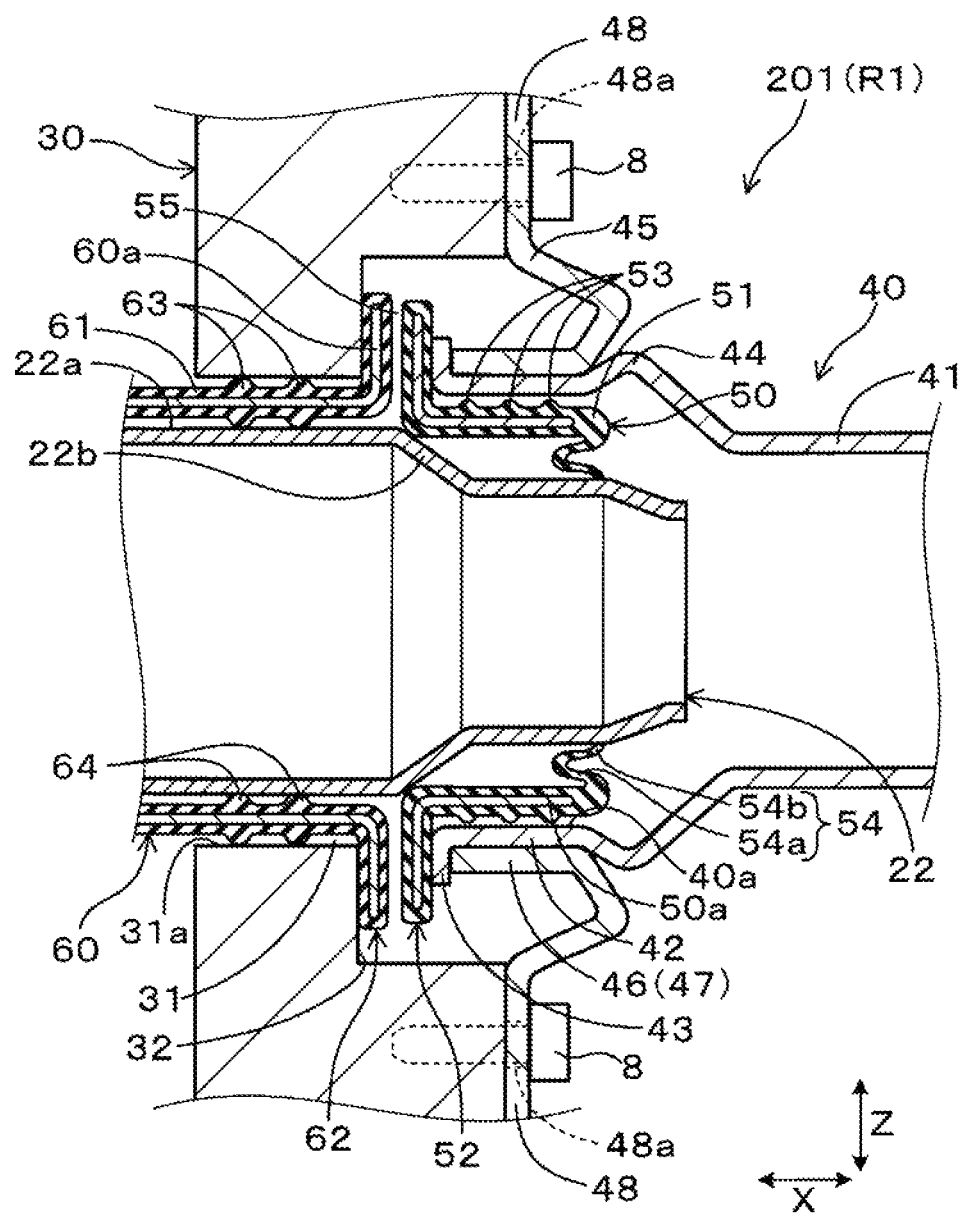
FIG. 11 shows a cross-sectional view illustrating a power conversion device according to a third embodiment corresponding to FIG. 5.

As shown in FIG. 11, a power conversion device 201 according to a third embodiment differs from that of the second embodiment in the structure of the sealing member 50.

Others are the same as the second embodiment.

The projection 54 of the sealing member 50 is configured as a lip-shaped sealing portion that generally projects radially inward toward the outer peripheral surface 22a of the lead-in pipe 22 from the distal end section of the tubular portion 51 (right end in FIG. 11).

The projection 54 includes a first annular portion 54a, which extends from the tubular portion 51 toward the sealing member 60 in the first direction X, and a second annular portion 54b, which extends from the distal end of the first annular portion 54a in the opposite direction. That is, the projection 54 is shaped as if it is folded back at the distal end of the first annular portion 54a.

The second annular portion 54b of the projection 54 abuts against the outer peripheral surface 22a of the lead-in pipe 22. At this time, the second annular portion 54b of the projection 54 is compressed by the outer peripheral surface 22a of the lead-in pipe 22 and elastically deforms, so that watertight sealing performance is exerted.

According to the power conversion device 201 of the third embodiment, since the second annular portion 54b of the projection 54 of the sealing member 50 abuts against the outer peripheral surface 22a of the lead-in pipe 22, the contact area for a watertight seal is increased.

Additionally, the same operational advantages as the second embodiment are achieved.

Note that, as a modification related to the third embodiment, in particular, a lip-shaped sealing portion without the second annular portion 54b of the projection 54 of the sealing member 50 may be employed. Furthermore, the lip-shaped sealing portion can be applied to at least one of the projection 54 of the sealing member 50 and the projection 64 of the sealing member 60.

Fourth Embodiment

Figure 12:
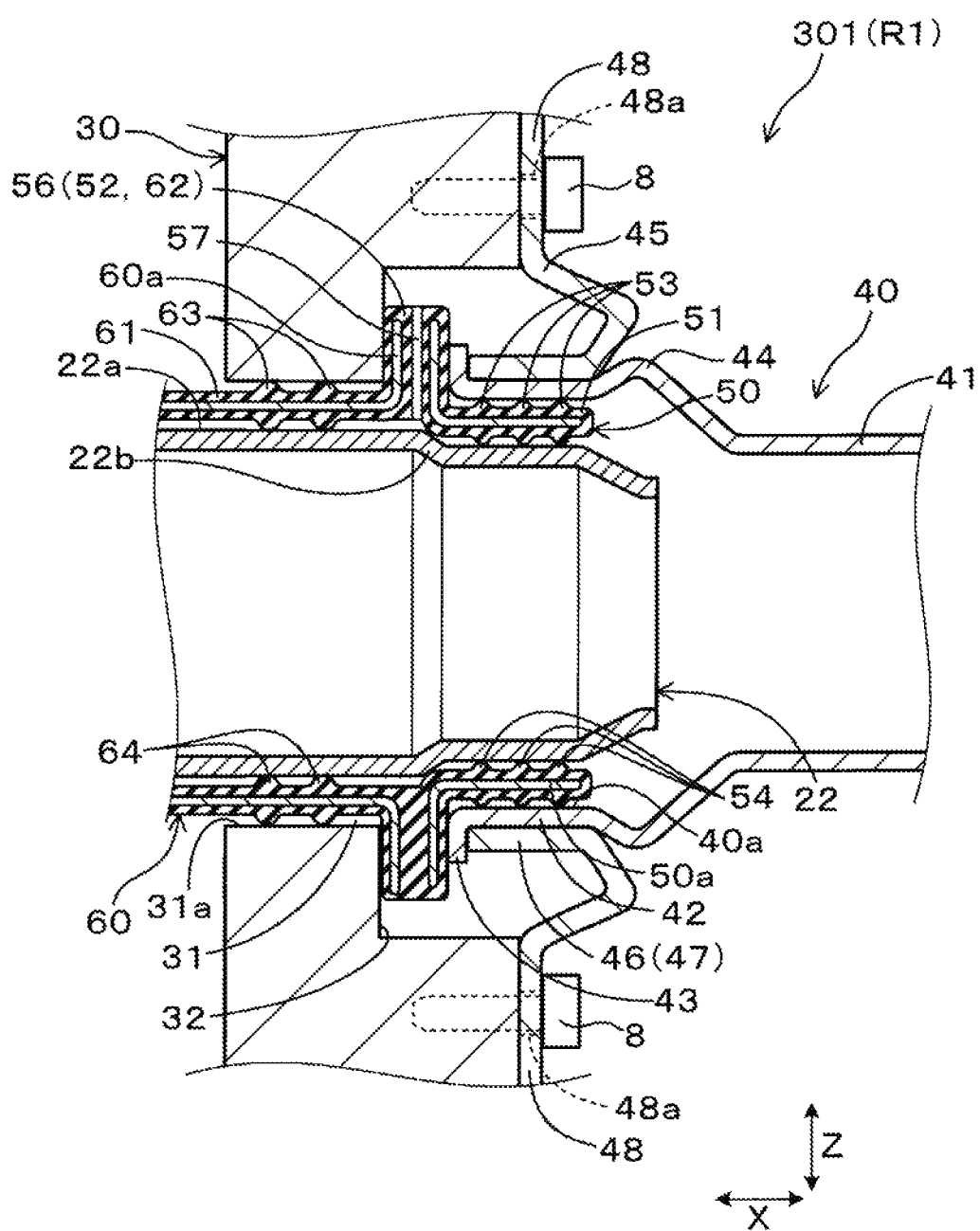
FIG. 12 shows a cross-sectional view illustrating a power conversion device according to a fourth embodiment corresponding to FIG. 5.

As shown in FIG. 12, a power conversion device 301 according to a fourth embodiment differs from that of the second embodiment in that the sealing member 50 and the sealing member 60 are integrated to form a sealing unit.

Others are the same as the second embodiment.

A through-hole 57, which serves as the refrigerant discharging passage, is provided at a boundary portion 56 between the sealing member 50 and the sealing member 60. The boundary portion 56 includes the flange portion 52 of the sealing member 50 and the flange portion 62 of the sealing member 60. The through-hole 57 connects the space between the sealing member 50 and the outer peripheral surface 22a of the lead-in pipe 22 to the outside of the case 30.

The sealing unit is previously assembled to the connector 40 by inserting the tubular portion 51 of the sealing member 50 in the connector 40 to form a subassembly.

According to the power conversion device 301 of the fourth embodiment, the number of components is decreased by integrating the sealing member 50 and the sealing member 60. Furthermore, since the sealing unit is previously assembled to the connector 40 to form the subassembly, the number of processes required for assembling is reduced compared with a case in which the sealing member 50 and the sealing member 60 are separately assembled.

Furthermore, with the structure in which the sealing member 50 and the sealing member 60 are integrated, when the refrigerant flows into the space on the outer peripheral surface 22a of the lead-in pipe 22, the refrigerant is discharged to the outside of the case 30 through the through-hole 57, so that the refrigerant is prevented from flowing into the case 30.

Additionally, the same operational advantages as the second embodiment are achieved.

Fifth Embodiment

Figure 13:
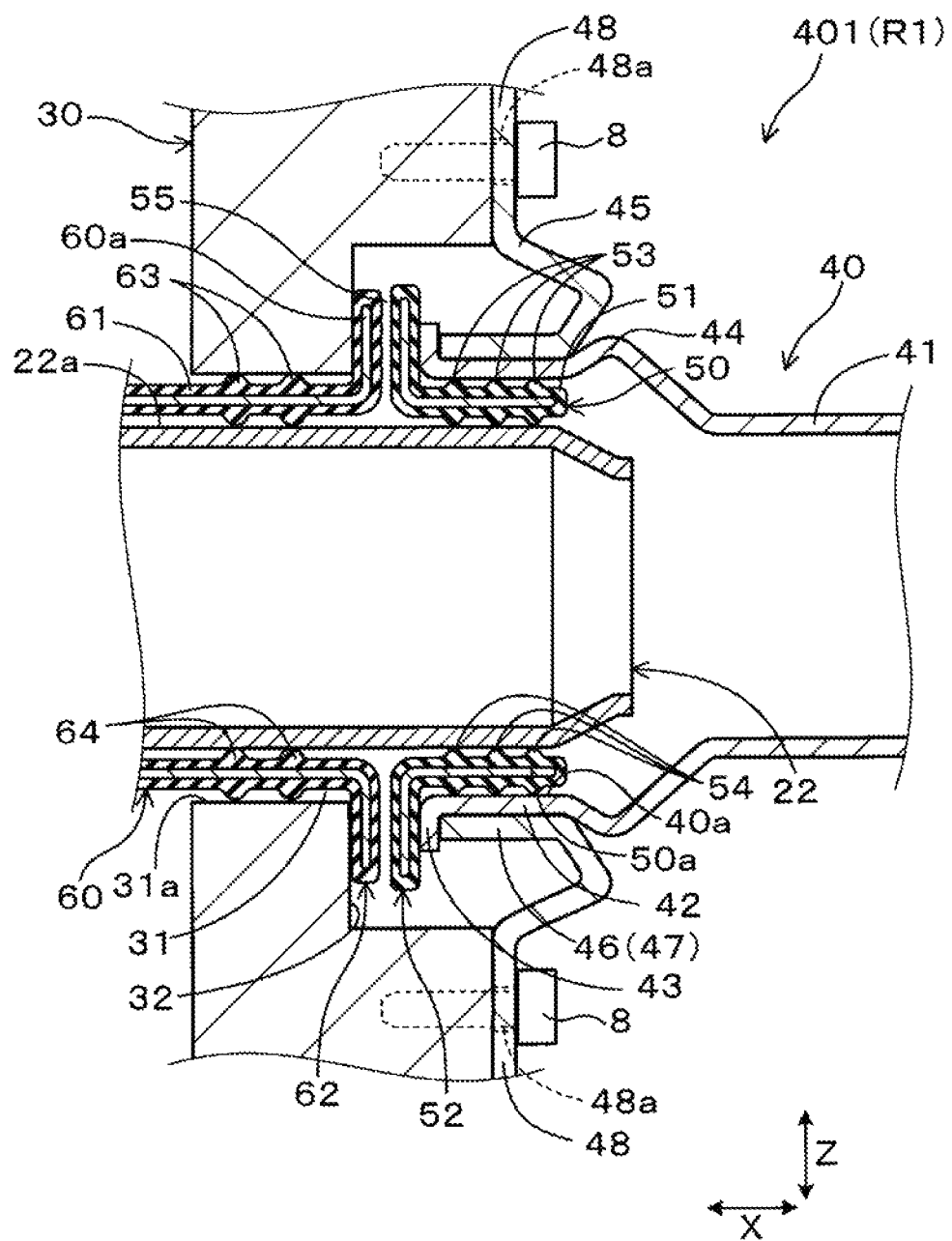
FIG. 13 shows a cross-sectional view illustrating a power conversion device according to a fifth embodiment corresponding to FIG. 5.

As shown in FIG. 13, a power conversion device 401 according to a fifth embodiment differs from that of the second embodiment in that the lead-in pipe 22 does not include the step 22b (refer to FIG. 5).

Others are the same as the second embodiment.

According to the power conversion device 401 of the fifth embodiment, the structure of the lead-in pipe 22 is simplified by omitting the section corresponding to the step 22b on the lead-in pipe 22.

Additionally, the same operational advantages as the second embodiment are achieved.

Sixth Embodiment

Figure 14:
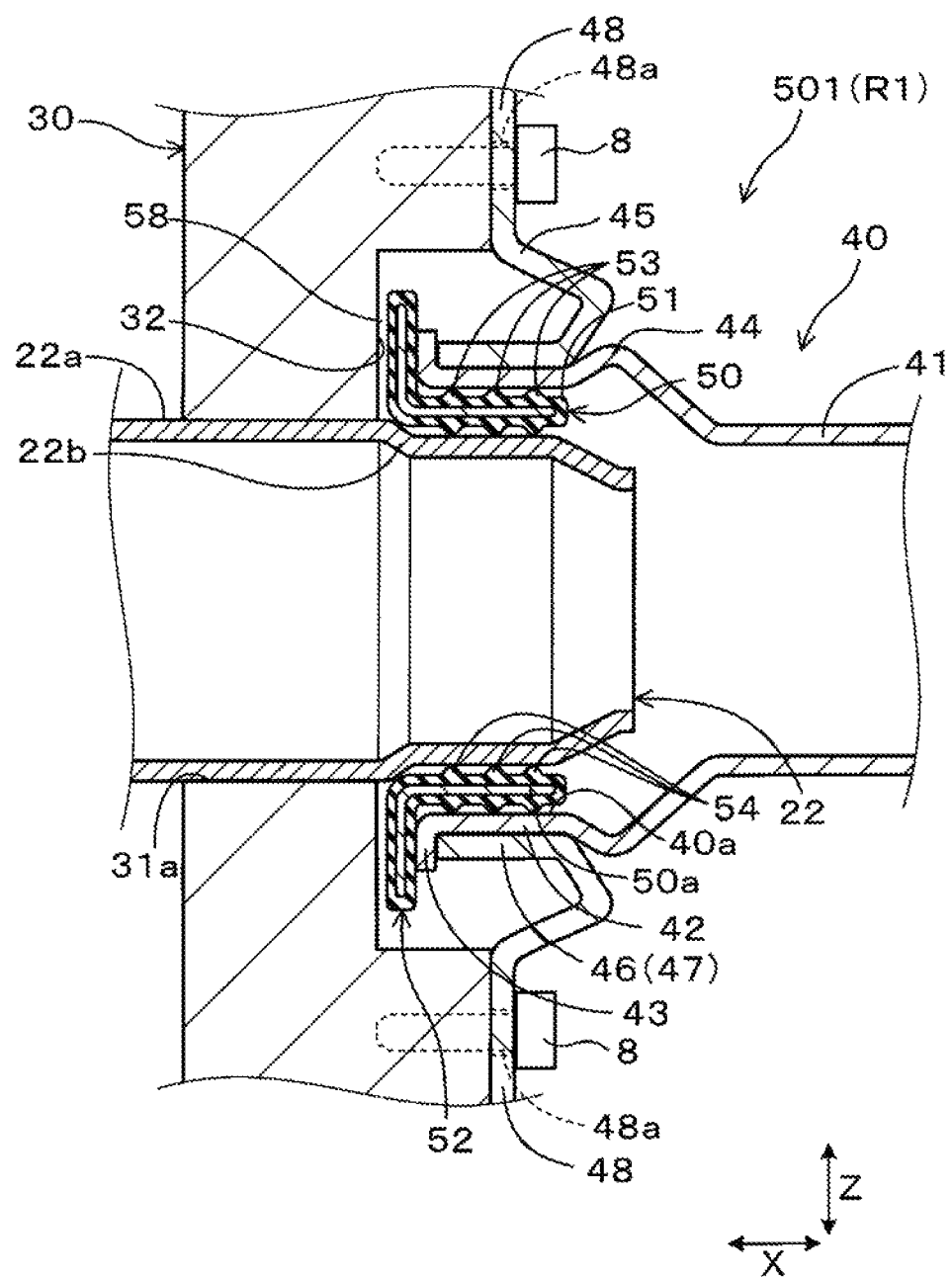
FIG. 14 shows a cross-sectional view illustrating a power conversion device according to a sixth embodiment corresponding to FIG. 5.

As shown in FIG. 14, a power conversion device 501 according to a sixth embodiment differs from that of the second embodiment in that the sealing member 60 (refer to FIG. 7) is not provided.

Others are the same as the second embodiment.

In a state in which the connector 40 is secured to the case 30, a gap 58 is formed between the flange portion 52 of the sealing member 50 and the end surface 32 of the case 30 in the first direction X. The gap 58 forms the refrigerant discharging passage that connects the space between the sealing member 50 and the outer peripheral surface 22a of the lead-in pipe 22 to the outside of the case 30.

The gap 58 functions to discharge the refrigerant to the outside of the case 30 when the refrigerant flows into the space on the outer peripheral surface 22a of the lead-in pipe 22. The gap 58 prevents the refrigerant from flowing into the case 30.

According to the sixth embodiment, the number of components of the power conversion device 501 is reduced compared with the second embodiment.

Additionally, the same operational advantages as the second embodiment are achieved.

Seventh Embodiment

Figure 15:
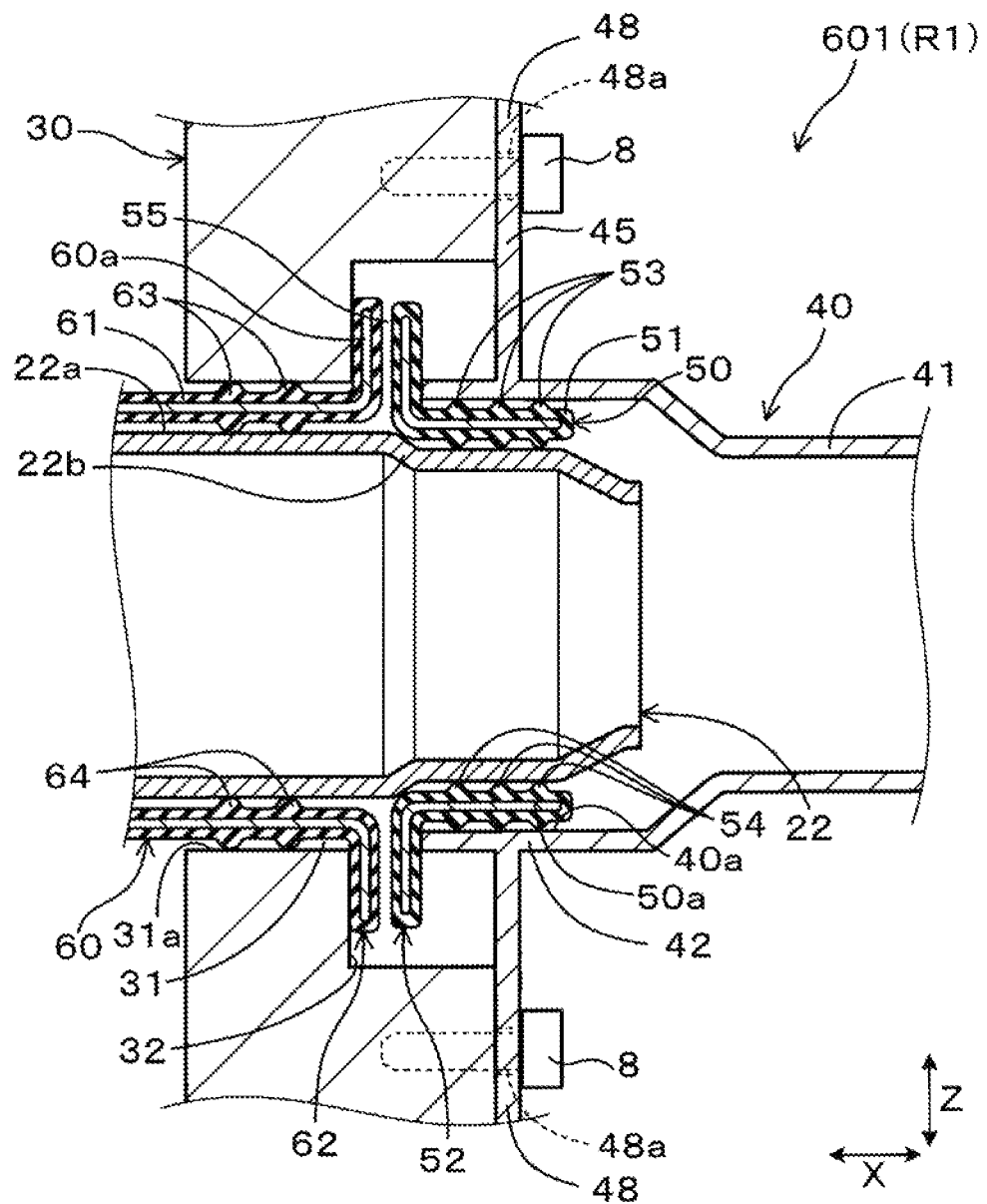
FIG. 15 shows a cross-sectional view illustrating a power conversion device according to a seventh embodiment corresponding to FIG. 5.

As shown in FIG. 15, a power conversion device 601 according to a seventh embodiment differs from that of the first embodiment in the structure of the connector 40. The connector 40 is configured as an integrally molded part including the pipe portion 41 and the flange portion 45.

Others are the same as the second embodiment.

According to the power conversion device 601 of the seventh embodiment, the structure of the connector 40 is simplified.

Additionally, the same operational advantages as the second embodiment are achieved.

Although the present disclosure has been described in accordance with the embodiments, it is understood that the present disclosure is not limited to the embodiments and the configurations. The present disclosure embraces various modifications and deformations that come within the range of equivalency. Additionally, various combinations and forms, or other combinations and forms including only one or more additional elements, or less than all elements are included in the scope and ideas obtainable from the present disclosure.

The above-described embodiments exemplify the case in which the connector 40 is connected to each of the lead-in pipe 22 and the discharge pipe 23 of the cooling device 20. Instead, the connector 40 may be connected to one of the lead-in pipe 22 and the discharge pipe 23, and a connector having a different structure from the connector 40 may be connected to the other one of the lead-in pipe 22 and the discharge pipe 23.

The above-described embodiments exemplify the case in which the connector 40 made of a metal material is employed. Instead, a connector 40 made of a material other than the metal material such as a plastic material may be employed.

The above-described embodiments exemplify the case in which the core material 50a, 60a of the sealing member 50, 60 is covered with the plastic portion. Instead, the core material 50a, 60a may be omitted and the sealing member may be formed of only the plastic portion.

The above-described embodiments exemplify the case in which the sealing member 50 includes the flange portion 52, and the sealing member 60 includes the flange portion 62. Instead, the structure in which the flange portion 52 is omitted from the sealing member 50, or the structure in which the flange portion 62 is omitted from the sealing member 60 may be employed.

The above-described embodiments exemplify the stack-type cooling device 20, which cools the semiconductor modules 10. However, the structure of the cooling device is not limited to the stack type, and a cooling device having a different structure may be employed as required as long as the cooling device 20 includes the heat exchanger that is capable of exchanging heat with the semiconductor modules, the lead-in pipe that introduces a refrigerant to the heat exchanger, and the discharge pipe that discharges the refrigerant from the heat exchanger.

What is claimed is:

1. A power conversion device comprising:
a semiconductor module including a switching element;
a cooling device including a heat exchanger capable of exchanging heat with the semiconductor module, a lead-in pipe that introduces a refrigerant to the heat exchanger, and a discharge pipe that discharges the refrigerant from the heat exchanger;
a case that accommodates the semiconductor module and the cooling device;
a connector connected to a refrigerant flow pipe, which is at least one of the lead-in pipe and the discharge pipe of the cooling device on an outside of the case; and
a sealing member that makes a watertight seal between the refrigerant flow pipe and the connector, wherein
the sealing member includes a connector-side tubular portion, which is located between an inner peripheral surface of the connector and an outer peripheral surface of the refrigerant flow pipe, a first watertight seal projection, which projects radially outward in an annular shape from the connector-side tubular portion toward the inner peripheral surface of the connector, and a second watertight seal projection, which projects radially inward in an annular shape from the connector-side tubular portion toward the outer peripheral surface of the refrigerant flow pipe,
the refrigerant flow pipe is located in a through-hole formed through the case,
when the sealing member is referred to as a first sealing member, a second sealing member is provided to make an airtight seal between the through-hole of the case and the refrigerant flow pipe at a position closer to the heat exchanger of the cooling device than the first sealing member,
the second sealing member includes a case-side tubular portion, which is located between an inner peripheral surface of the through-hole and the outer peripheral surface of the refrigerant flow pipe, a first airtight seal projection, which projects radially outward in an annular shape from the case-side tubular portion toward the inner peripheral surface of the through-hole, and a second airtight seal projection, which projects radially inward in an annular shape from the case-side tubular portion toward the outer peripheral surface of the refrigerant flow pipe, and
the first sealing member and the second sealing member define a gap therebetween, and the gap serves as a refrigerant discharging passage that connects a space between the first sealing member and the outer peripheral surface of the refrigerant flow pipe to the outside of the case.

2. The power conversion device according to claim 1, wherein
at least one of the case, the refrigerant flow pipe, and the second sealing member includes a first sealing member restricting section, which restricts a movement of the first sealing member in a removing direction.

3. The power conversion device according to claim 2, wherein
the first sealing member includes a disk-like flange portion, which extends radially outward from the connector-side tubular portion, the second sealing member includes a disk-like flange portion, which extends radially outward from the case-side tubular portion, and the flange portion of the second sealing member is located to overlap the flange portion of the first sealing member in the removing direction to form the first sealing member restricting section.

4. The power conversion device according to claim 1, wherein
at least one of the case and the refrigerant flow pipe includes a second sealing member restricting section, which restricts a movement of the second sealing member in a removing direction.

5. The power conversion device according to claim 4, wherein
the second sealing member restricting section is a locking portion provided on the case, and the locking portion restricts the movement of the second sealing member in the removing direction when a hook, which is formed by part of the first airtight seal projection that protrudes radially outward, is caught on the locking portion.

6. The power conversion device according to claim 1, further comprising:
a refrigerant discharging passage that connects the space between the sealing member and the outer peripheral surface of the refrigerant flow pipe to the outside of the case.

7. The power conversion device according to claim 1, wherein
the first sealing member includes a first opposing surface, which faces the second sealing member, the second sealing member includes a second opposing surface, which faces the first sealing member, and at least one of the first opposing surface and the second opposing surface includes a refrigerant discharging groove, which is recessed in an axial direction.

8. The power conversion device according to claim 1, wherein
the connector is made of a metal material.

9. A power conversion device comprising:
a semiconductor module including a switching element;
a cooling device including a heat exchanger capable of exchanging heat with the semiconductor module, a lead-in pipe that introduces a refrigerant to the heat exchanger, and a discharge pipe that discharges the refrigerant from the heat exchanger;
a case that accommodates the semiconductor module and the cooling device;
a connector connected to a refrigerant flow pipe, which is at least one of the lead-in pipe and the discharge pipe of the cooling device on an outside of the case; and
a sealing member that makes a watertight seal between the refrigerant flow pipe and the connector, wherein
the sealing member includes a connector-side tubular portion, which is located between an inner peripheral surface of the connector and an outer peripheral surface of the refrigerant flow pipe, a first watertight seal projection, which projects radially outward in an annular shape from the connector-side tubular portion toward the inner peripheral surface of the connector, and a second watertight seal projection, which projects radially inward in an annular shape from the connector-side tubular portion toward the outer peripheral surface of the refrigerant flow pipe,
the refrigerant flow pipe is located in a through-hole formed through the case,
when the sealing member is referred to as a first sealing member, a second sealing member is provided to make an airtight seal between the through-hole of the case and the refrigerant flow pipe at a position closer to the heat exchanger of the cooling device than the first sealing member,
the second sealing member includes a case-side tubular portion, which is located between an inner peripheral surface of the through-hole and the outer peripheral surface of the refrigerant flow pipe, a first airtight seal projection, which projects radially outward in an annular shape from the case-side tubular portion toward the inner peripheral surface of the through-hole, and a second airtight seal projection, which projects radially inward in an annular shape from the case-side tubular portion toward the outer peripheral surface of the refrigerant flow pipe, and
the first sealing member and the second sealing member are integrated, a through-hole is formed at a boundary portion of the first sealing member and the second sealing member, and the through-hole serves as a refrigerant discharging passage that connects a space between the first sealing member and the outer peripheral surface of the refrigerant flow pipe to the outside of the case.

10. The power conversion device according to claim 9, wherein
at least one of the case, the refrigerant flow pipe, and the second sealing member includes a first sealing member restricting section, which restricts a movement of the first sealing member in a removing direction.

11. The power conversion device according to claim 10, wherein
the first sealing member includes a disk-like flange portion, which extends radially outward from the connector-side tubular portion, the second sealing member includes a disk-like flange portion, which extends radially outward from the case-side tubular portion, and the flange portion of the second sealing member is located to overlap the flange portion of the first sealing member in the removing direction to form the first sealing member restricting section.

12. The power conversion device according to claim 9, wherein
at least one of the case and the refrigerant flow pipe includes a second sealing member restricting section, which restricts a movement of the second sealing member in a removing direction.

13. The power conversion device according to claim 12, wherein
the second sealing member restricting section is a locking portion provided on the case, and the locking portion restricts the movement of the second sealing member in the removing direction when a hook, which is formed by part of the first airtight seal projection that protrudes radially outward, is caught on the locking portion.

14. The power conversion device according to claim 9, further comprising:
a refrigerant discharging passage that connects the space between the sealing member and the outer peripheral surface of the refrigerant flow pipe to the outside of the case.

15. The power conversion device according to claim 9, wherein
the connector is made of a metal material.

* * * * *